(12) United States Patent
Massaia

(10) Patent No.: US 9,183,915 B2
(45) Date of Patent: Nov. 10, 2015

(54) WORKPIECE-HOLDING UNIT FOR INSTALLATION ON MACHINING CENTERS FOR CONNECTING RODS

(75) Inventor: Marco Massaia, Turin (IT)

(73) Assignee: VIGEL S.P.A., Borgaro Torinese (IT)

( * ) Notice: Subject to any disclaimer, the term of this patent is extended or adjusted under 35 U.S.C. 154(b) by 9 days.

(21) Appl. No.: 13/507,799

(22) Filed: Jul. 30, 2012

(65) Prior Publication Data

US 2013/0032982 A1 Feb. 7, 2013

(30) Foreign Application Priority Data

Aug. 4, 2011 (IT) ................................ TO2011U0082

(51) Int. Cl.
| | | |
|---|---|---|
| *B23Q 3/08* | (2006.01) | |
| *G11C 11/22* | (2006.01) | |
| *B23Q 1/00* | (2006.01) | |
| *B23Q 3/06* | (2006.01) | |

(52) U.S. Cl.
CPC .............. *G11C 11/22* (2013.01); *B23Q 1/0018* (2013.01); *B23Q 3/061* (2013.01); *B23Q 3/062* (2013.01); *B23Q 3/082* (2013.01)

(58) Field of Classification Search
USPC .......................................................... 269/25
See application file for complete search history.

(56) References Cited

U.S. PATENT DOCUMENTS

| | | | | |
|---|---|---|---|---|
| 3,733,939 A | * | 5/1973 | Paysinger et al. ................ | 82/113 |
| 3,747,444 A | * | 7/1973 | Schubert .......................... | 82/142 |
| 4,441,059 A | * | 4/1984 | Watanabe ......................... | 318/39 |
| RE32,211 E | * | 7/1986 | Jerue et al. ....................... | 82/1.2 |
| 4,779,318 A | * | 10/1988 | Henderson ....................... | 29/38 B |
| 4,929,038 A | * | 5/1990 | Reinartz et al. ............. | 303/119.3 |
| 4,942,650 A | * | 7/1990 | Howarth ........................... | 29/38 B |
| 5,044,055 A | * | 9/1991 | Howarth et al. .................... | 29/49 |
| 5,105,538 A | | 4/1992 | Hoag et al. | |
| 5,239,901 A | * | 8/1993 | Lin ................................. | 82/119 |
| 5,489,212 A | * | 2/1996 | Yoshimoto et al. ............. | 434/55 |
| 5,746,423 A | * | 5/1998 | Arov .............................. | 269/266 |
| 6,102,636 A | * | 8/2000 | Geise ............................ | 409/231 |
| 6,249,944 B1 | * | 6/2001 | Perkins, Jr. .................... | 29/38 B |
| 6,338,705 B1 | * | 1/2002 | Cavallo et al. .................. | 483/14 |
| 6,506,143 B1 | * | 1/2003 | Goto et al. ....................... | 483/54 |
| 6,848,347 B1 | * | 2/2005 | Kalinsky ....................... | 82/1.11 |
| 6,880,214 B2 | * | 4/2005 | Studemann et al. .......... | 29/27 C |

(Continued)

FOREIGN PATENT DOCUMENTS

| | | |
|---|---|---|
| CN | 201357319 Y | 12/2009 |
| DE | 199 00 2932 A1 | 8/1999 |
| DE | 29922068 U1 | 2/2000 |
| DE | 20 2006 003402 U1 | 6/2006 |
| DE | 10 2006 048495 A1 | 4/2008 |
| EP | 0 872 305 A2 | 10/1998 |

(Continued)

*Primary Examiner* — Lee D Wilson
*Assistant Examiner* — Alvin Grant
(74) *Attorney, Agent, or Firm* — Modiano & Associati; Daniel J. O'Byrne; Albert Josif

(57) ABSTRACT

A workpiece-holding unit for installation on machining centers for connecting rods, comprising a crosspiece which is adapted to be rotatably supported about its axis in front of a machining head of the machining center and has internal, hydraulic longitudinal ducts which communicate with respective hydraulic outlets on the main faces of the crosspiece and are connected to hydraulic feed means. Several workpiece-holding tools are installable on the main faces of the crosspiece and are provided with positioning mechanisms and locking mechanisms for at least one connecting rod, which are hydraulically operated via respective hydraulic lines leading at positions aligned to said hydraulic outlets.

20 Claims, 21 Drawing Sheets

(56) References Cited

U.S. PATENT DOCUMENTS

| | | | |
|---|---|---|---|
| 7,640,665 B2 * | 1/2010 | Hirose et al. | 29/898.02 |
| 2009/0250859 A1 | 10/2009 | Okumura et al. | |
| 2009/0293970 A1 * | 12/2009 | Fuller | 137/625 |

FOREIGN PATENT DOCUMENTS

| | | |
|---|---|---|
| EP | 1331061 A1 | 7/2003 |
| EP | 1690621 A1 | 8/2006 |
| WO | WO2010/109305 A1 | 9/2010 |

* cited by examiner

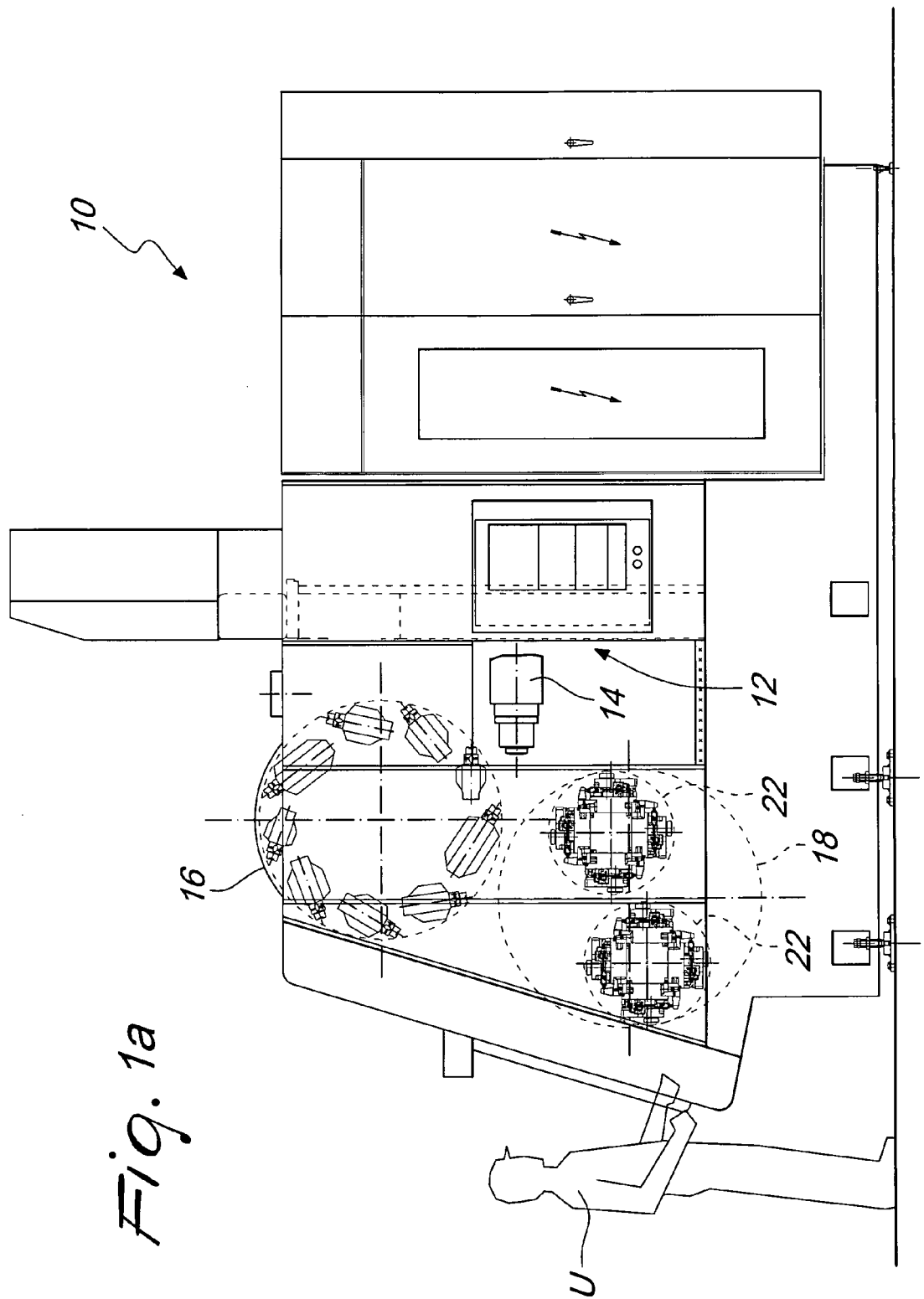

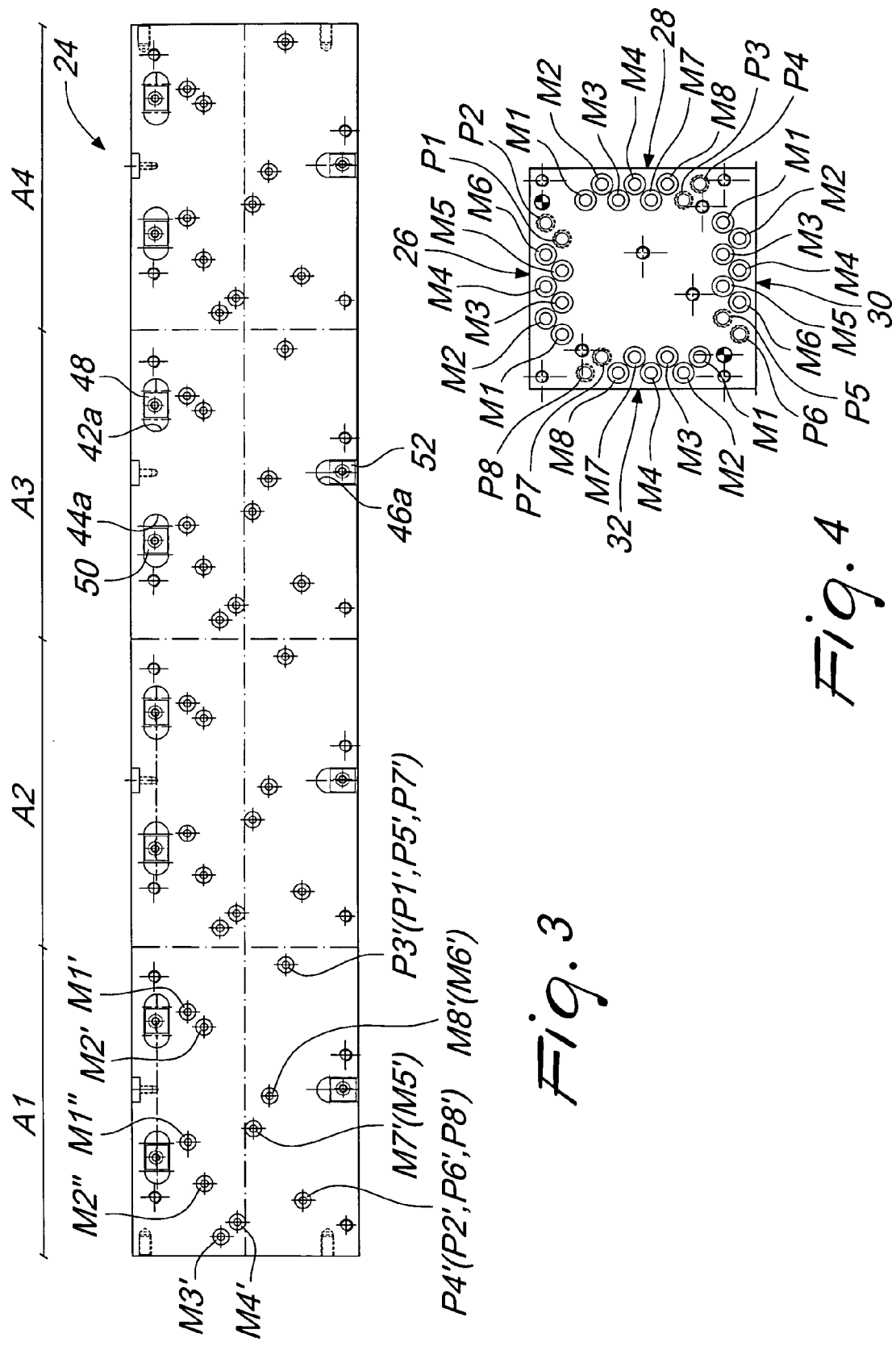

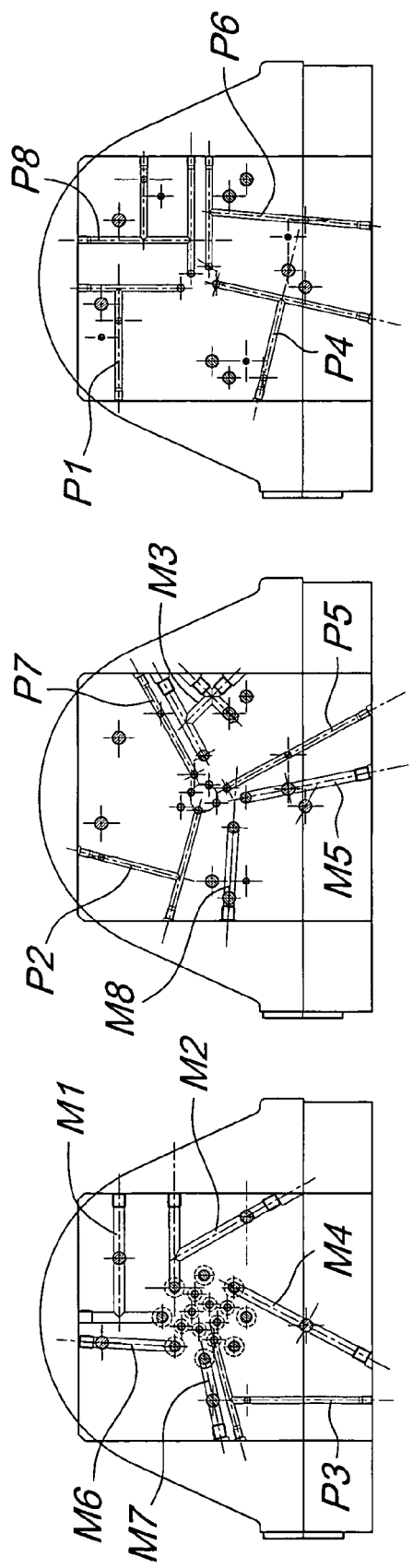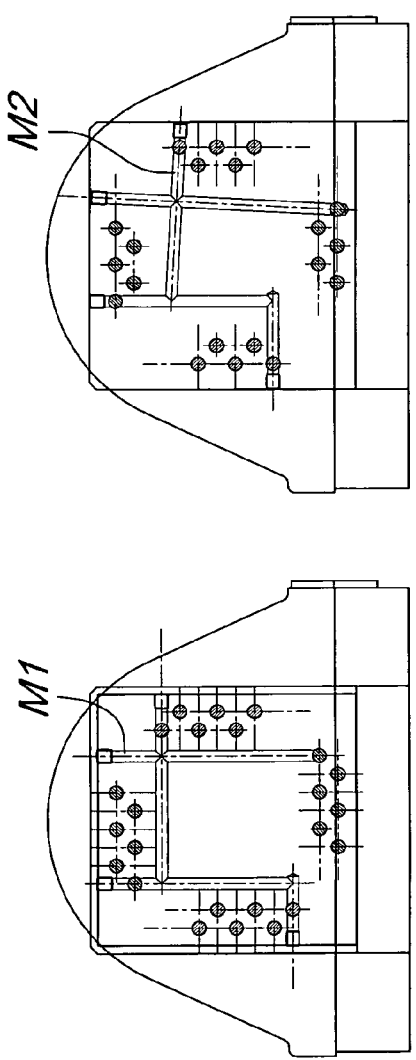

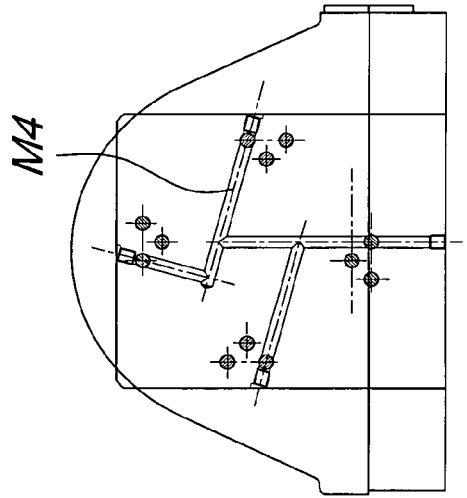
Fig. 12
Fig. 13
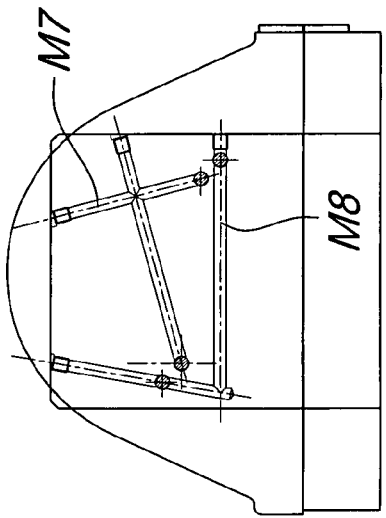
Fig. 14
Fig. 15
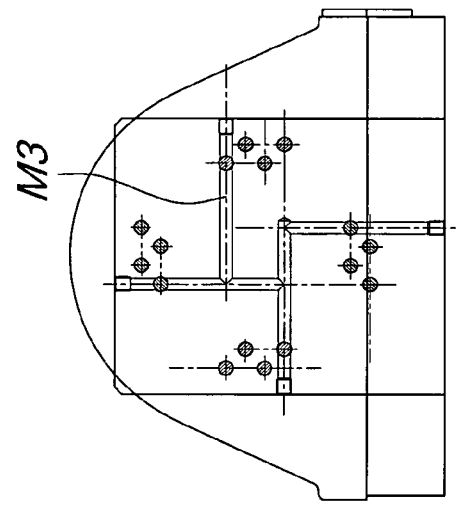

WORKPIECE-HOLDING UNIT FOR INSTALLATION ON MACHINING CENTERS FOR CONNECTING RODS

The present invention relates to a workpiece-holding unit for installation on machining centers for connecting rods, particularly, for connecting rods of internal-combustion engines.

BACKGROUND OF THE INVENTION

As known, the connecting rods of engines, after moulding, are subjected to a series of rough/finishing chip-forming machinings, most of which are carried out upon the big end and the small end of the connecting rod. These operations can be carried out on machining centers, which typically comprise a motorized machining head which is movable along three axes and is generally provided with a plurality of chucks, e.g., four chucks, in front of which the connecting rods are supported.

During machining, the connecting rods must be locked at specific areas and with calibrated locking forces, which may vary depending on the specific machining to be carried out, both because the positioning/locking mechanisms which engage the connecting rod should not interfere with the machining tool, and because the locking forces, in certain cases, could deform the connecting rod and, consequently, affect the machining accuracy if the deformed area is to be machined.

However, every machining center is provided with a limited number of hydraulic lines and pneumatic lines which can be operated independently from one another in order to control the positioning/locking mechanisms (e.g., eight hydraulic lines and eight pneumatic lines are usually available at most). Therefore, until today, the above-mentioned need for positioning the connecting rods and locking them at different areas and with different forces has prevented from performing all the rough/finishing machinings in a single machining center, and has required to implement lines with a plurality of stations, each of which is specifically equipped for carrying out only one operation (or, at most, a few operations) upon connecting rods of a single type.

As the person skilled in the art will immediately understand, the above circumstance is undesirable. In fact, it would be preferable to have machining centers each having a higher flexibility in relation to the variety of operations which can be carried out and to the different types of connecting rods which can be machined, so that the use of the machining centers can be optimized depending on the production requirements.

SUMMARY OF THE INVENTION

Therefore, the aim of the present invention is to provide a workpiece-holding unit for installation in machining centers for connecting rods of engines, which optimizes the use of the hydraulic lines and pneumatic lines available for positioning the connecting rods, as well as for locking them and controlling their position, so that all the rough/finishing machinings, for which different positioning steps and locking steps are required, can be carried out in a single machining center and upon a high number of connecting rods even of different types.

BRIEF DESCRIPTION OF THE DRAWINGS

The invention will be now described in more detail with reference to a few preferred, non-exclusive embodiments, shown by way of non-limiting example in the attached drawings, wherein:

FIGS. 1*a* and 1*b* are a side elevation view and a plan view respectively which diagrammatically show a machining center for connecting rods, in which a workpiece-holding unit according to the invention is installed;

FIG. 3 is a view in side elevation of a first separate component of the workpiece-holding unit according to the invention;

FIG. 4 is a front view of the first component of the workpiece-holding unit of FIG. 1;

FIGS. 7 to 9 are three schematic, cross-sectional views of the second component of FIG. 5 along respective transverse plans;

FIGS. 10 to 15 are six diagrammatical, cross-sectional views of the third component of FIG. 6 made along respective transverse plans;

DESCRIPTION OF THE PREFERRED EMBODIMENTS

Figure 1B:
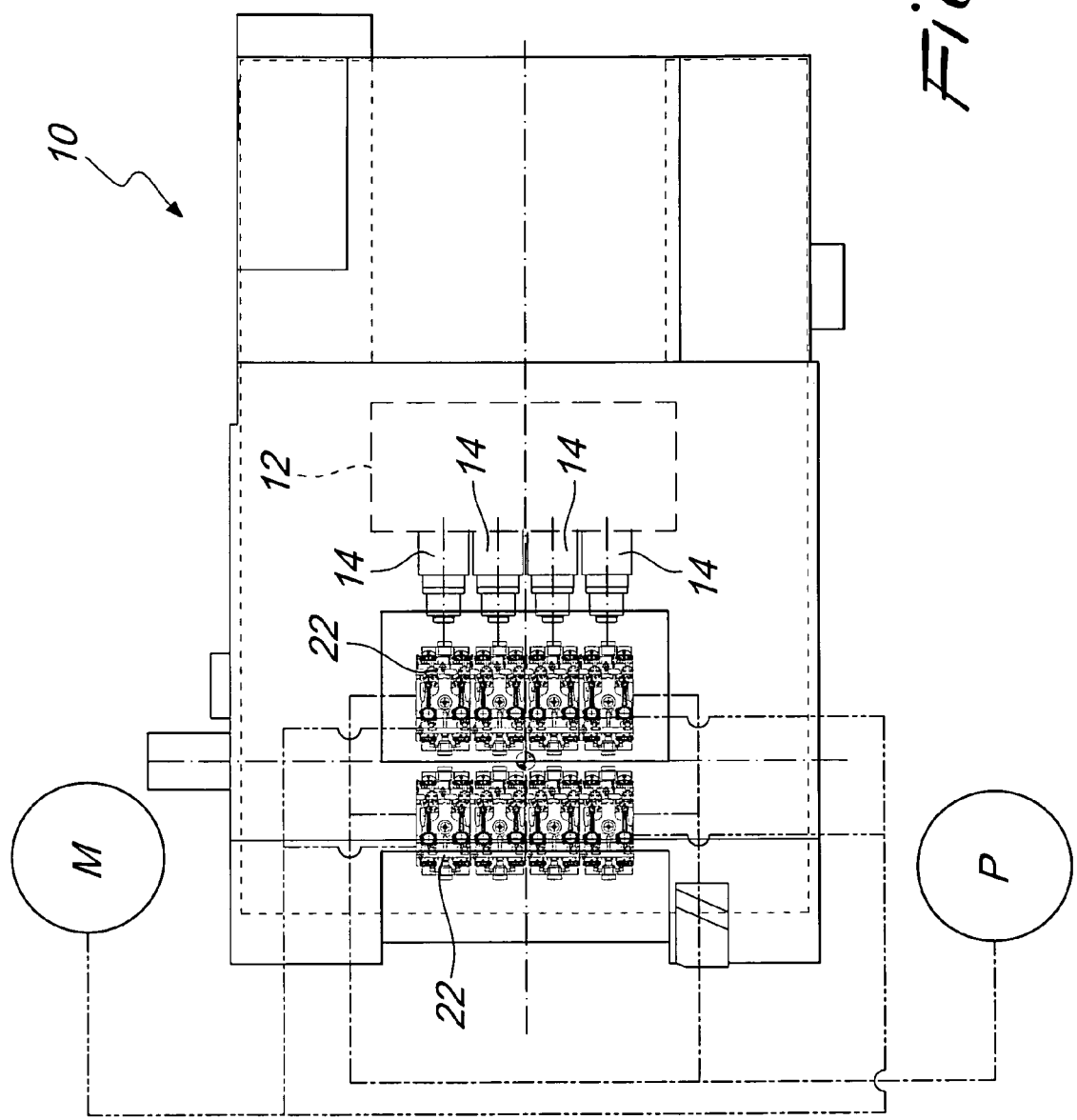

With initial reference to FIGS. 1a and 1b, a conventional machining center for connecting rods of engines is referred to as 10. Machining center 10 is provided with a motorized machining head 12, which is movable along three axes lying at right angles to one another and supports four chucks 14. In front of machining head 12, a tool-holding drum 16 is arranged at an upper position, to which the machining head has access for tool-changing operations, as well as a workpiece-holding drum 18, at a lower position, which supports two workpiece-holding units 22 of a type according to the invention at diametrically opposed positions. As will be described in more detail below, each workpiece-holding unit can support up to sixteen connecting rods. While one of the workpiece-holding units faces the chucks and its connecting rods are subjected to the required machinings, the other unit faces the operator U so that its connecting rods (which have already been machined) can be manually replaced.

The machining center is conventionally provided with a hydraulic feed unit M and a pneumatic feed unit P, which are both connected to workpiece-holding unit 22 in order to operate positioning mechanisms, locking mechanisms and control mechanisms of the workpiece-holding unit, as will be clarified below. The hydraulic feed unit and the pneumatic feed unit are each capable of operating eight independent lines per each crosspiece.

Figure 2:
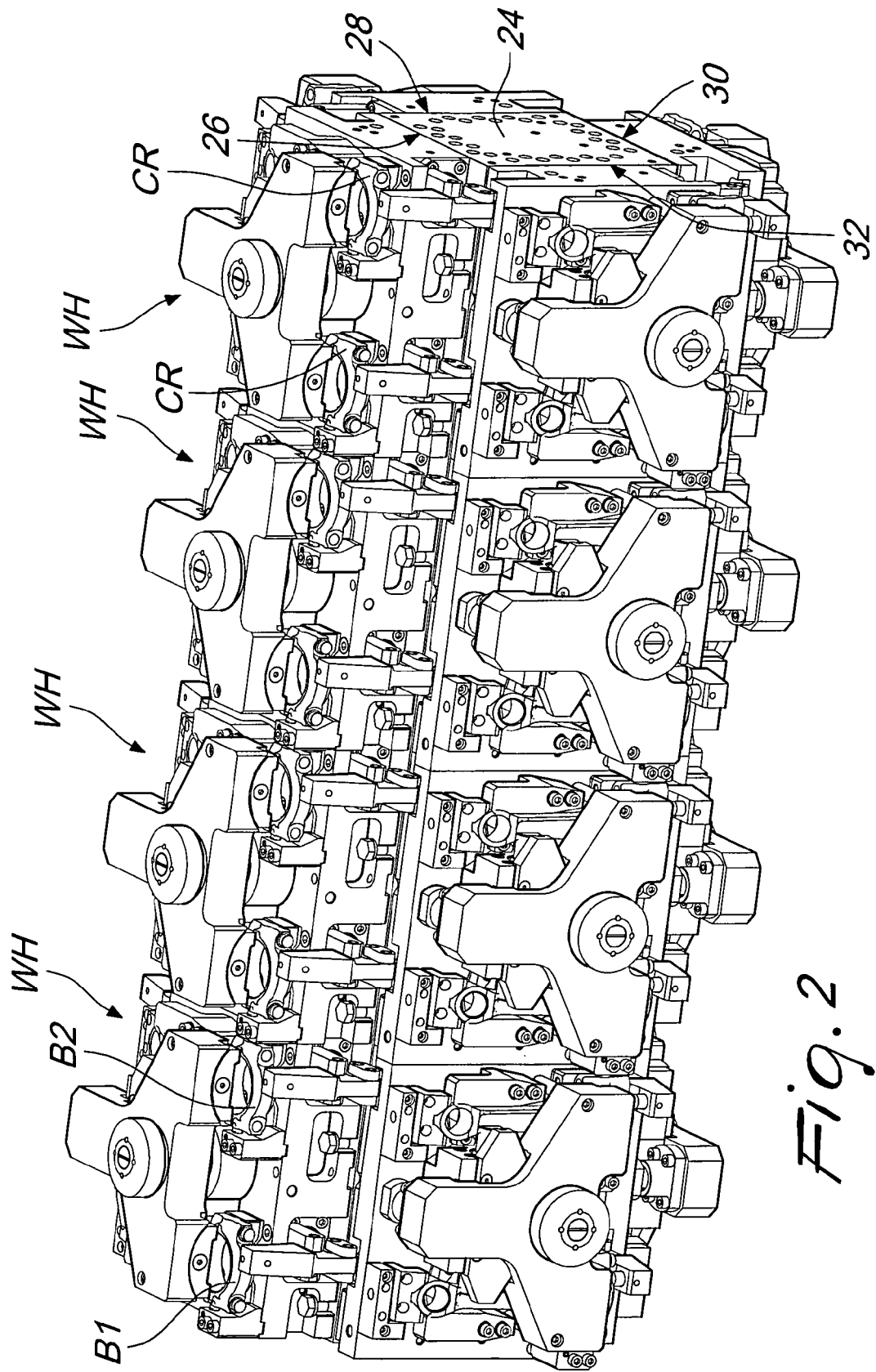
FIG. 2 is a perspective view of a workpiece-holding unit according to the invention.

With reference to FIGS. 2 to 4, each workpiece-holding unit 22 comprises a horizontal crosspiece 24 having a square section, which is supported at its opposite ends by workpiece-holding drum 18 in such a way that it can rotate by steps of a quarter-turn about its axis. Each of the four main faces 26, 28, 30, 32 of crosspiece 24 can bear four workpiece-holding tools WH installed thereon (which may be of different types, even though all the workpiece-holding tools shown in FIG. 2 are of a same type), which will be described in more detail below. Each workpiece-holding tool WH, in turn, can hold a pair of connecting rods CR arranged side-by-side at right angles to crosspiece 24. As will be described in detail below, per each machining cycle sixteen connecting rods can be mounted at most on two adjacent faces of each crosspiece; the workpiece-holding tools installed on the remaining two faces must remain unloaded.

As shown in detail in FIGS. 3 and 4, crosspiece 24 has a plurality of longitudinal through ducts in communication with respective outlets formed on its four main faces. As will be described in more detail below, twenty-four of these ducts are connected to the hydraulic feed unit of the machining center, in order to drive the positioning mechanisms and the locking mechanisms which are provided on the workpiece-holding tools; the remaining eight ducts are connected to the pneumatic feed unit of the machining center and lead to pneumatic sensors provided on the workpiece-holding tools, in order to identify the type, the orientation and the correct positioning of the connecting rods.

With particular reference to FIG. 4, each of the four main faces of crosspiece 24 has a row of four, outer ducts extending just below the surface, as well as a row of four inner ducts which are arranged alternately to the outer ducts at a slightly inner position. The first three ducts (clockwise direction in FIG. 4) of both the outer and the inner rows are hydraulic ducts, while the last duct of each row is a pneumatic duct.

Figure 6:
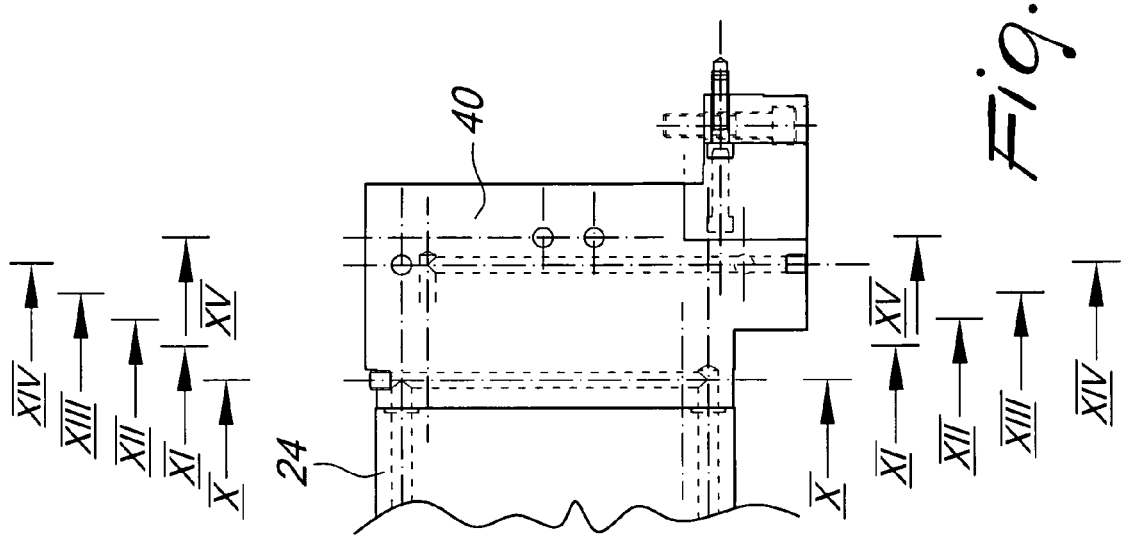
FIG. 6 is a view in side elevation of a third separate component of the workpiece-holding unit according to the invention.
Figure 5:
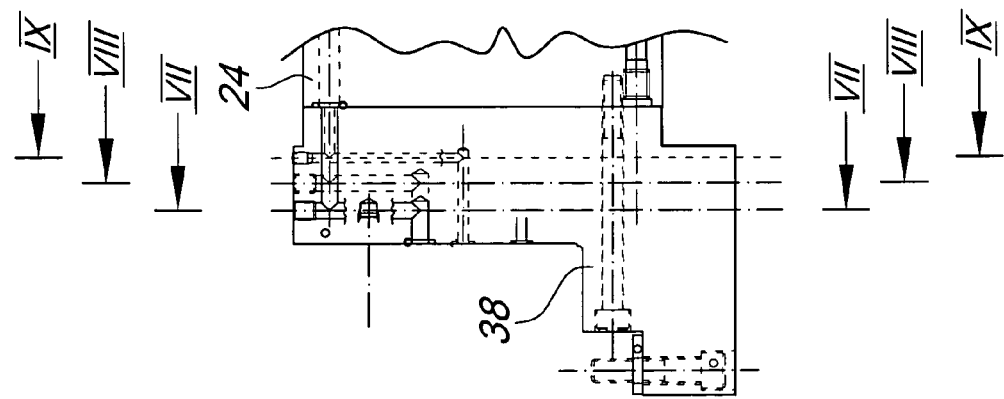
FIG. 5 is a view in side elevation of a second separate component of the workpiece-holding unit according to the invention.

The opposite ends of crosspiece 24 have respective distributors 38 and 40 (FIGS. 5 and 6) connected thereto. Distributors 38 and 40 have inner passages formed on staggered transverse planes, as shown in FIGS. 7 to 9 and 10 to 15 respectively, via which some of the ducts in the crosspiece are put into communication with one another, as will be now described.

The first ducts (clockwise direction in FIG. 4) of all the four outer rows are in communication with one another and, therefore, are referred to by the same reference number M2, as well as the second ducts of all the four outer rows, M4, the first ducts of all the four inner rows, M1, and the second ducts of all the four inner ducts, M3. The third duct of each outer row only communicates with the third duct of the opposite, outer row. Again, the ducts which communicate with each other are referred to by the same reference numbers M6 and M8 respectively. Similarly, the third duct of each inner row only communicates with the third duct of the opposite, inner row, and also in this case the ducts which communicate with each other are referred to by the same reference numbers M5 and M7 respectively. The remaining eight pneumatic ducts P1-P8 are independent form one another.

As will be described in more detail below, the first ducts of both the inner and the outer rows, M1 and M2 respectively, hydraulically feed axial positioning mechanisms which are provided on the workpiece-holding tools in order to correctly position the connecting rod in the axial direction (hereinafter, the "axial direction" for the connecting rod is referred to as the direction extending between the center of the big end and the center of the small end); the second ducts of both the inner and the outer rows, M3 and M4 respectively, hydraulically feed lateral positioning mechanisms; the third ducts of both the inner and the outer rows, M5 and M6 for the first face and the third face, M7 and M8 for the second face and the fourth face, hydraulically feed locking mechanisms.

Each face of the crosspiece is ideally splitted into four consecutive areas A1, A2, A3, A4, which are delimited by center lines in FIG. 3. Each area is engageable by a respective workpiece-holding tool and, as mentioned above, has outlets which are in communication with the ducts of both the inner and the outer rows extending just below the respective face. The outlets have the same arrangement in each area. In particular, each area has:

- a first hydraulic outlet M1' and a second hydraulic outlet M1", which are longitudinally aligned to, and in communication with, the first duct of inner row M1,
- a third hydraulic outlet M2' and a fourth hydraulic outlet M2", which are longitudinally aligned to, and in communication with, the first duct of outer row M2,
- a fifth hydraulic outlet M3' which is aligned to, and in communication with, the first duct of inner row M3,
- a sixth hydraulic outlet M4' which is aligned to, and in communication with, the first duct of outer row M4,
- a seventh hydraulic outlet M5' or M7', which is aligned to, and in communication with, the third duct of inner row, M5 or M7, depending on the face in question,
- an eighth hydraulic outlet M6' or M8', which is aligned to, and in communication with, the third duct of outer row, M6 or M8, depending on the face in question,
- a first pneumatic outlet P1' or P3' or P5' or P7', which is aligned to, and in communication with, the pneumatic duct of inner row, P1 or P3 or P5 or P7, depending on the face in question, and
- a second pneumatic outlet P2' or P4' or P6' or P8', which is aligned to, and in communication with, the pneumatic duct of outer row, P2 or P4 or P6 or P8, depending on the face in question.

Furthermore, each area has two longitudinally elongated, aligned reference slots 42a, 44a, which are formed near one of the longitudinal edges of the face, as well as a transversely elongated reference slot 46a, which extends from the opposite edge at an intermediate position between the two longitudinally elongated reference slots. The slots on the crosspiece are adapted to cooperate with corresponding slots formed on the basements of the workpiece-holding tools, with interposition of respective keys 48, 50, 52, in order to ensure the correct positioning of the workpiece-holding tools with respect to the crosspiece.

FIGS. 16-25 show a first example of a workpiece-holding tool 60 installable on crosspiece 24. Workpiece-holding tool 60 comprises a basement 62, on the lower surface of which the above-cited, corresponding slots 42*b*, 44*b*, 46*b* are formed. The basement supports:

two support/control assemblies (which include the above-cited control mechanisms) arranged side-by-side, each of which is adapted to support a respective connecting rod B1, B2 (for better clarity, the connecting rods are only depicted by dashed lines in the Figures), two positioning assemblies (which include the above-cited positioning mechanisms), each of which is adapted to correctly position a respective connecting rod B1, B2 in both the axial and the lateral direction, and the above-cited locking mechanism, which is adapted to clamp both the connecting rods in the vertical direction after positioning.

One of the two support/control assemblies will be now described. The other assembly is substantially identical, except for minor parts which, if required, will be identified.

The support/control assemblies each comprise a first base 70, which supports the connecting rod near its small end, and a second base 72, which supports the connecting rod at its big end.

Figure 16:
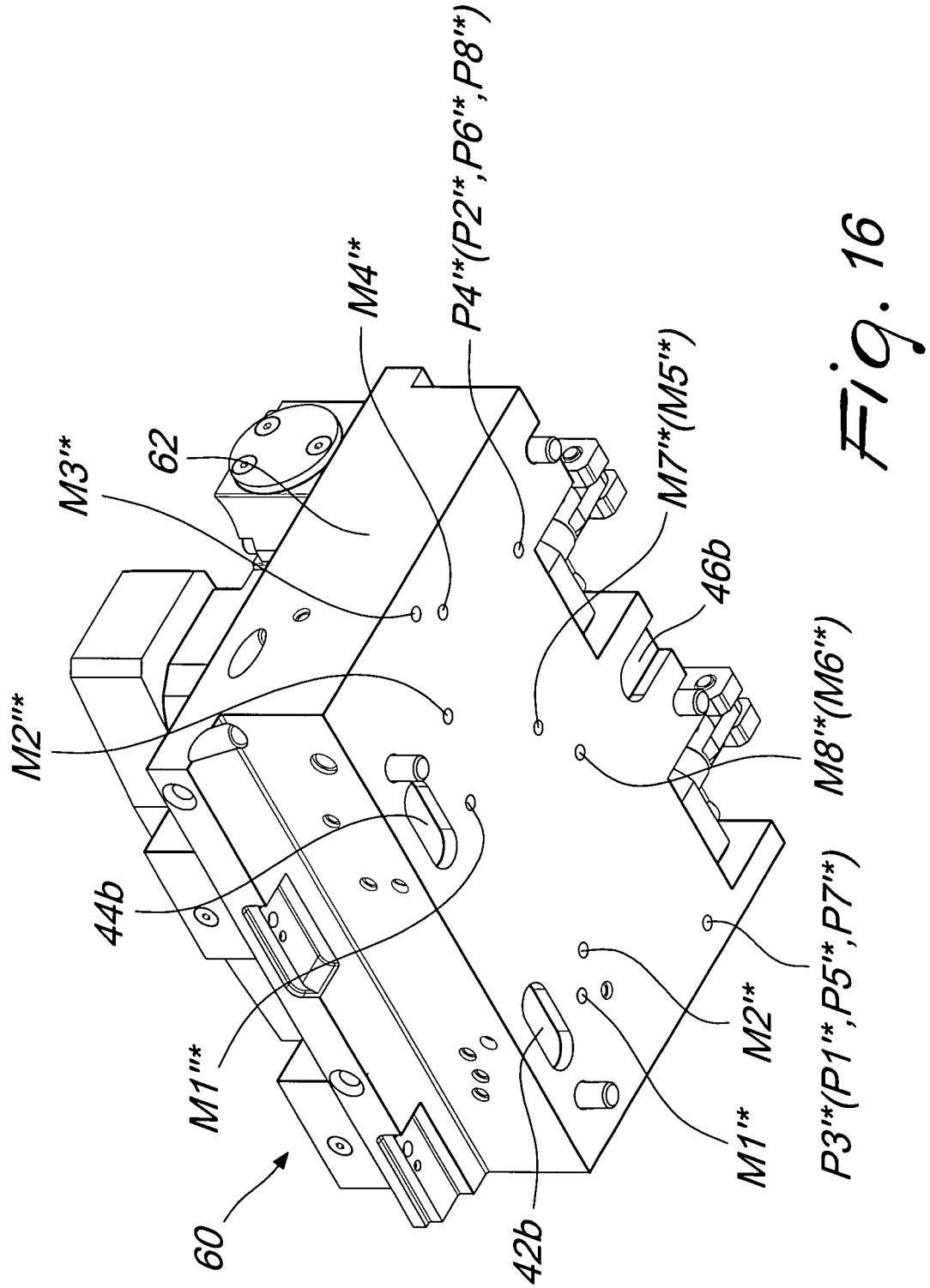
FIGS. 16 to 18 are three perspective views from different viewpoints of a fourth component of the workpiece-holding unit according to the invention.

First base 70 has a frusto-pyramidal profile rising from a poligonal bottom to a first support surface 70*a* (FIG. 21), which supports the connecting rod near its small end. A first pneumatic channel 74 (FIG. 21) leading to first support surface 70*a* is formed in the first base and communicates with a first pneumatic line (FIGS. 21, 25), 76 or 78 depending on the support/control assembly in question, which is formed in basement 62 and leads to the lower surface of the latter at a position aligned to outlets P1', P3', P5', P7' or P2', P4', P6', P8' respectively, via openings which, in FIG. 16, are referred to as P3'* (P1'*, P5'*, P7'*) and P4'* (P6'*, P8'*, P2'*).

Second base 72 has two support surfaces 72*a*, 72*b* for supporting the big end of the connecting rod at two mirror-like areas with respect to the axis of the connecting rod. Two pneumatic channels 80, 82 (which are only diagrammatically shown in FIG. 20) leading to support surfaces 72*a*, 72*b* respectively, are formed in the base and also communicate with first pneumatic line, 76 or 78 depending on the support/control assembly in question.

Only one of the positioning assemblies will be described, the other assembly being substantially identical except for minor parts which, if necessary, will be identified.

For the axial positioning of the connecting rod, each positioning assembly comprises a V-shaped abutment 83*a*, which is fixed to the basement near first base 70 by a support 83*b*, and against which the small end of the connecting rod is biased by a hydraulically operated pushing device engaging the big end. With particular reference to FIGS. 21 to 23 and 25, the pushing device comprises a rocker arm 84, which is hinged at an intermediate point to basement 62, and has a contact end 84*a* suitably shaped to abut against the exterior of the big end in a direction aligned to the axis of the connecting rod, as well as an opposite end 84*b* which is operatively connected, via a link rod 85, to an operative rod 86 of a horizontal, double-acting hydraulic cylinder embedded in basement 62. In the present disclosure, the expression "horizontal" defines the direction parallel to the plane defined by lower surface of basement 62, while the expression "vertical" defines a direction at right angles to this plane.

Figure 20:
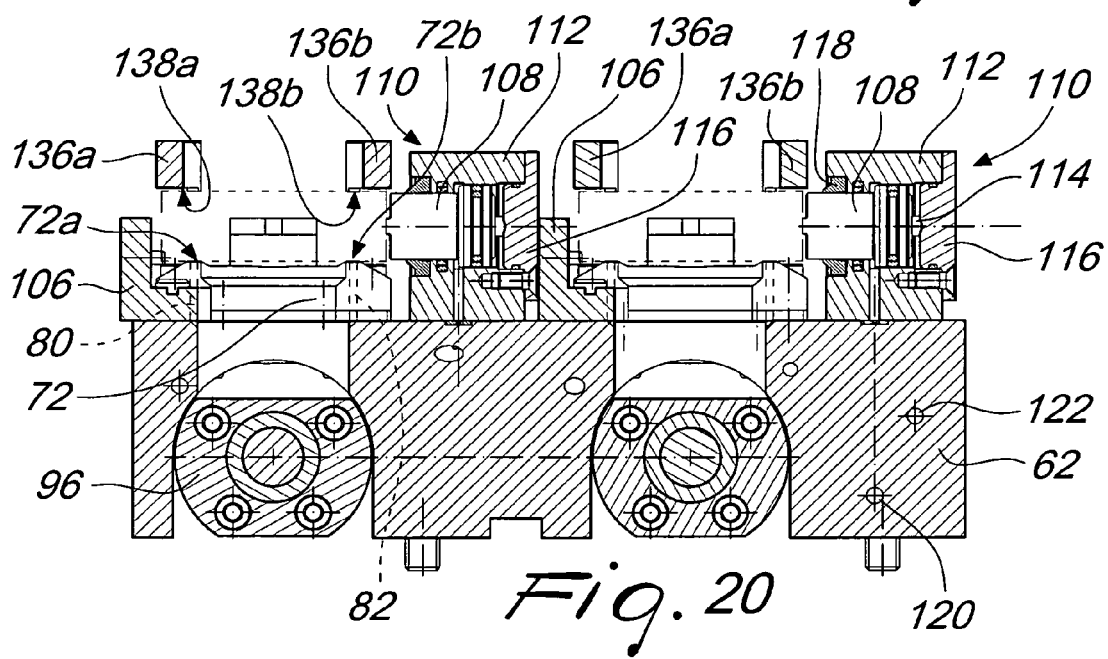
FIG. 20 is a view in cross-section of FIG. 19 along axis XX-XX.
Figure 21:
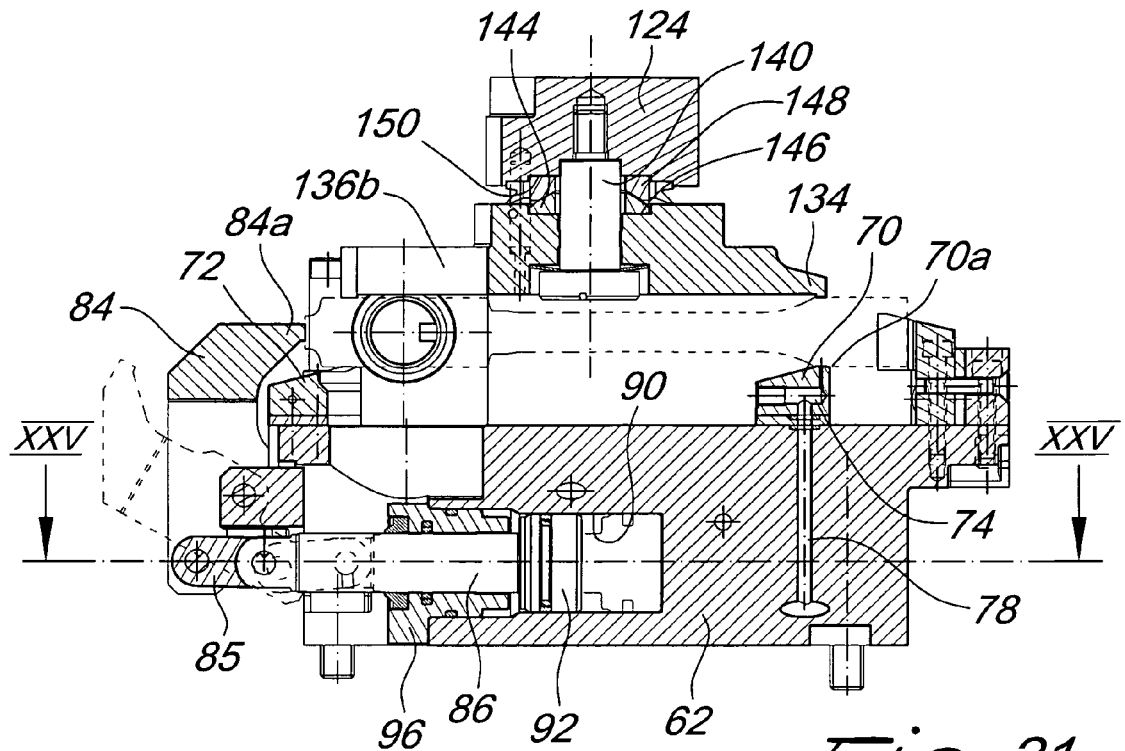
FIG. 21 is a view in cross-section of FIG. 19 along axis XXI-XXI.
Figure 25:
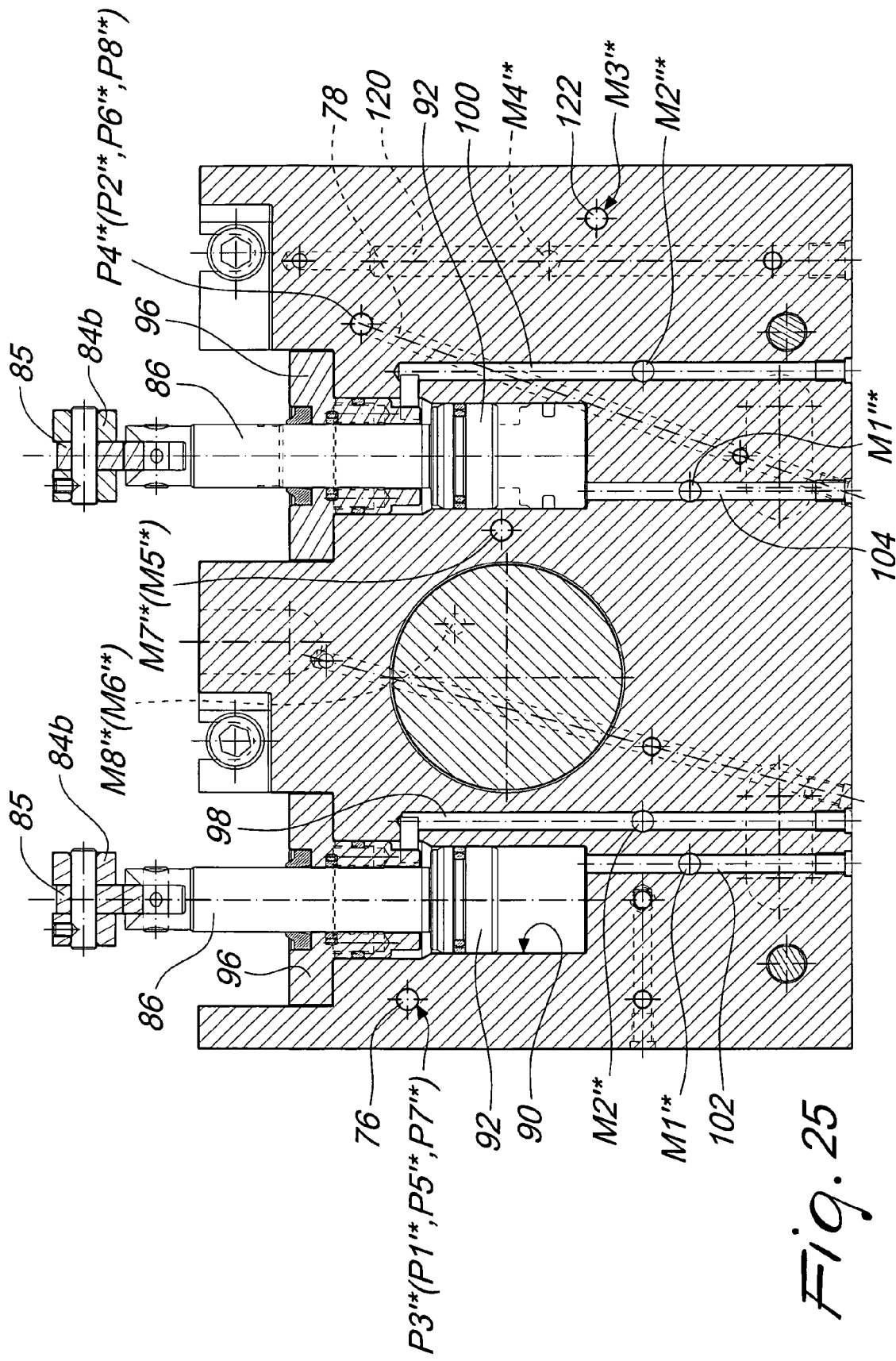
FIG. 25 is a view in cross-section of FIG. 21 along axis XXV-XXV.

Having now particular reference to FIGS. 20, 21 and 25, the horizontal, hydraulic cylinder comprises a cylindrical chamber 90 formed in the basement. A piston 92, to which operative rod 86 is coaxially connected, is sealingly slidable within cylindrical chamber 90. The cylindrical chamber leads to the outer surface of the basement, where it is sealingly closed by a cover 96 which is sealingly and slidably traversed by operative rod 86. The portion of the chamber on the side of the operative rod communicates with a first hydraulic line 98 or 100 (FIG. 25), depending on the positioning assembly in question, which is formed in basement 62 and leads to the lower surface of the latter at a position aligned to outlets M2' or M2", via openings which, in FIG. 16, are referred to as M2'* and M2"* respectively. The portion of the chamber on the side facing away from the operative rod communicates with a second hydraulic line 102 or 104, depending on the positioning assembly in question, which is formed in basement 62 and leads to the lower surface of the latter at a position aligned to outlets M1' or M1", via openings which, in FIG. 16, are referred to as M1'* and M1"* respectively.

Figure 24:
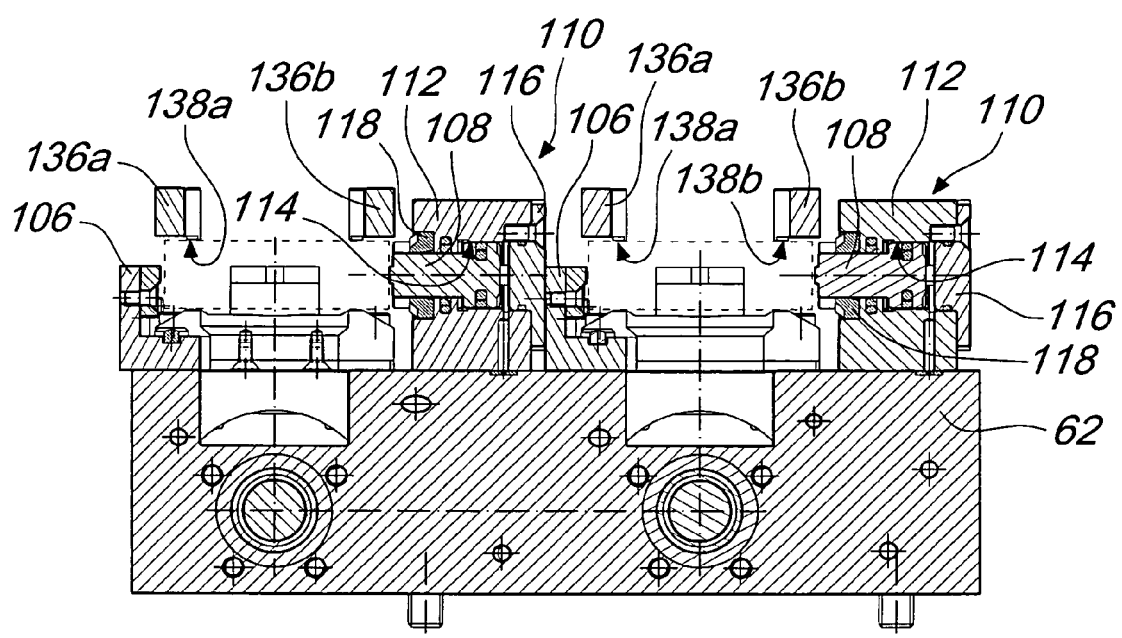
FIG. 24 is a view in cross-section of FIG. 19 along axis XXIV-XXIV.

Having now particular reference to FIGS. 20, 24, for the lateral positioning of the connecting rod, each positioning assembly comprises a lateral abutment 106 fixed to the basement, against which the big end of the connecting rod is biased by the piston 108 of a double-acting hydraulic actuator 110. Piston 108 radially engages the big end of the connecting rod at right angles to the axis of the connecting rod, and acts in contrast to lateral abutment 106. Hydraulic actuator 110 comprises a prismatic housing 112, which is horizontally traversed by a hole 114 in which piston 108 is sealingly slidable. One end of hole 114 is closed by a cap 116, while the opposite end is sealingly passed through by piston 108 and, to this purpose, is provided with seals such as 118 engaging the outer surface of piston 108. Piston 108 divides hole 114 into two chambers. The chamber on the side of the piston rod communicates with a third hydraulic line 120 which feeds the hydraulic actuators of both the positioning assemblies and leads to the lower surface of the basement at a position aligned to outlet M4', via an opening which, in FIG. 16, is referred to as M4'*. The chamber on the side facing away from the operative rod communicates with a fourth hydraulic line 122, which also feeds the hydraulic actuators of both the positioning assemblies and leads to the lower surface of the basement at a position aligned to outlet M3', via an opening which, in FIG. 16, is referred to as M3'* (FIGS. 20, 24 25).

Having now particular reference to FIGS. 17, 18, 21-23, locking mechanism 68 comprises a horizontal bar-shaped support 124, which is supported at its middle point by an operative rod 126 of a double-acting, vertical hydraulic cylinder, which is embedded within basement 62 with its operative rod directed upwards. The opposite ends of bar-shaped support 124 have respective, identical locking members 130, 132 anchored thereto, each of which is adapted to restrainedly push a respective connecting rod against its bases 70, 72. In particular, each of the locking members 130, 132 has a contact end 134 (FIGS. 21, 23) counterposed to support surface 70*a* of first base 70, which clamps the connecting rod near its small end, as well as two contact arms 136*a*, 136*b* having respective lower projections 138*a*, 138*b* counteposed to support surfaces 72*a*, 72*b* of second base 72, which clamp the connecting rod at its big end.

Figure 22:
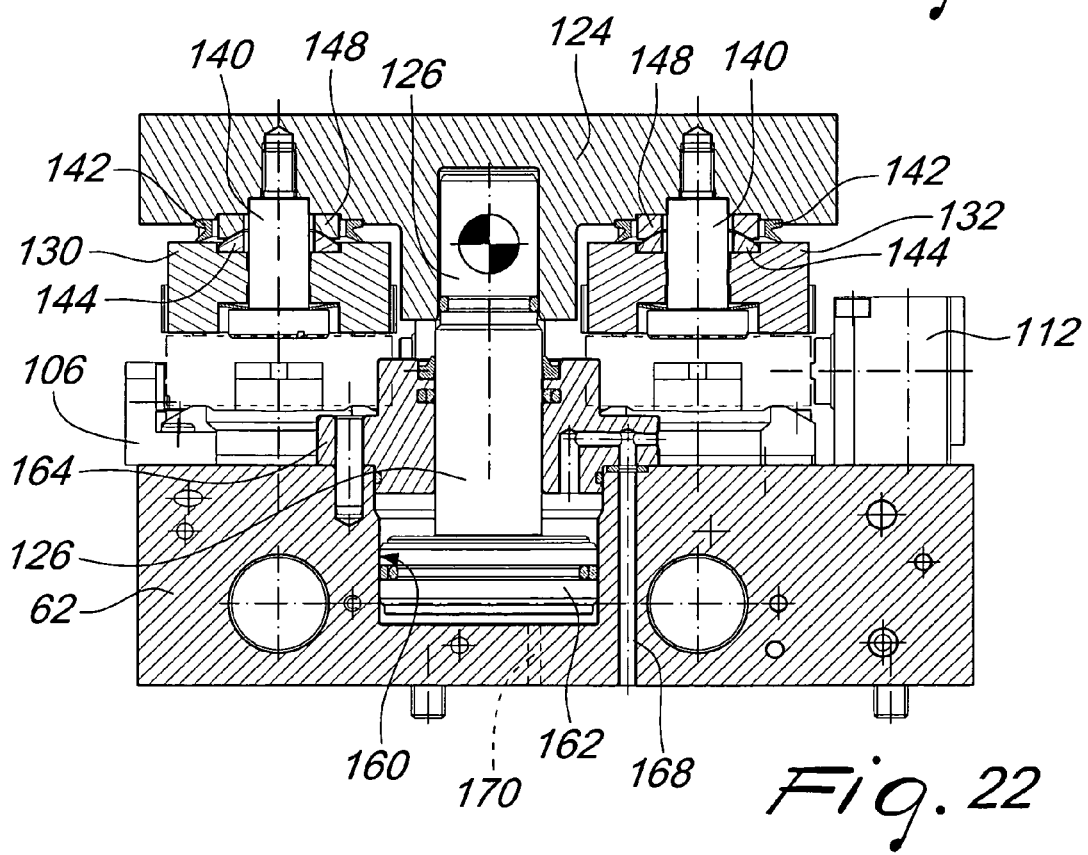
FIG. 22 is a view in cross-section of FIG. 19 along axis XXII-XXII.

Each of the locking members is anchored to horizontal bar-shaped support 124 by a screw 140, with interposition of a ball joint surrounded by a seal 142 (FIGS. 21, 22). Ball joint consists of a male ring 144 having a spheric outer profile, which is housed in a seat 146 of the pushing member (FIG. 21) and is coupled to a female ring 148 having a frusto-conical inner profile, which is housed in a seat 150 of bar-shaped support 124 (FIG. 21).

Figure 23:
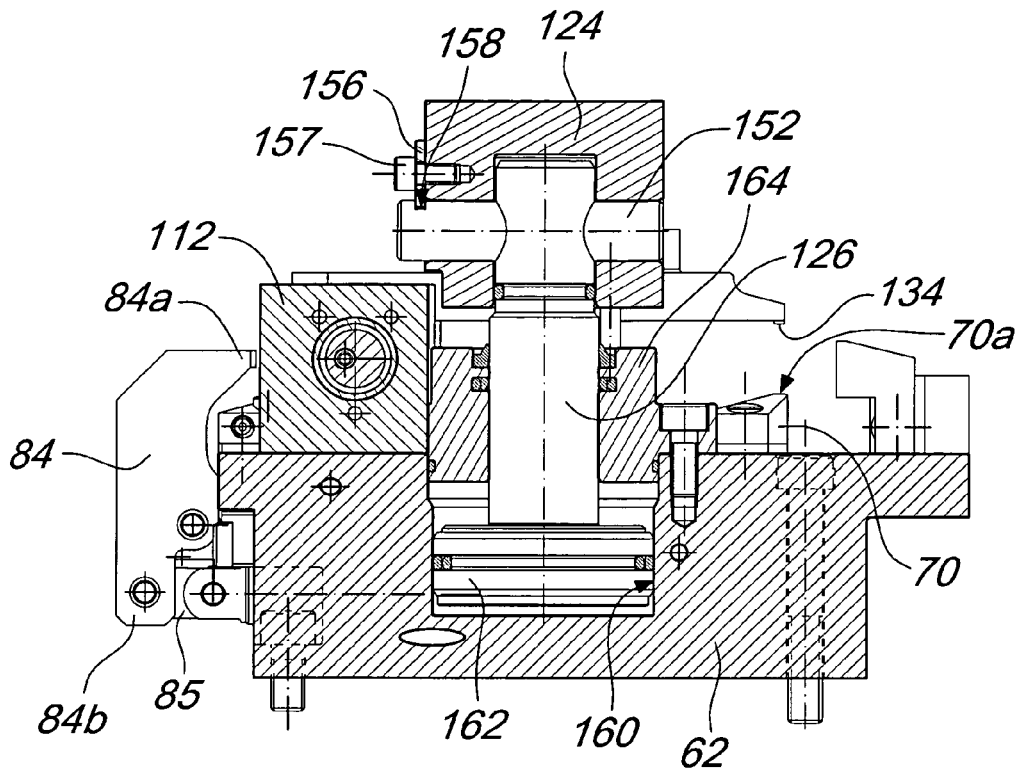
FIG. 23 is a view in cross-section of FIG. 19 along axis XXIII-XXIII.

Bar 124 is connected to operative rod 126 of vertical hydraulic cylinder 128 by a pin 152 which diametrically traverses the operative rod and engages a transverse hole 154 formed in the bar-shaped support (FIG. 23).

Figure 17:
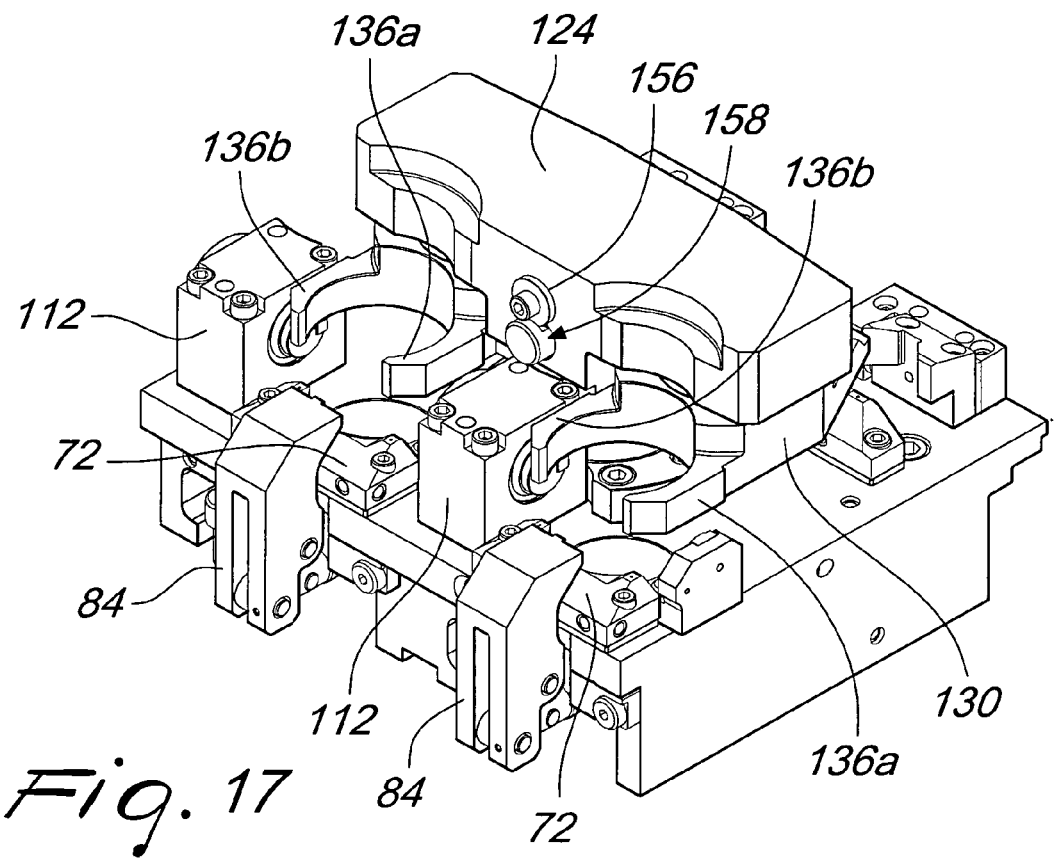
Figure 18:
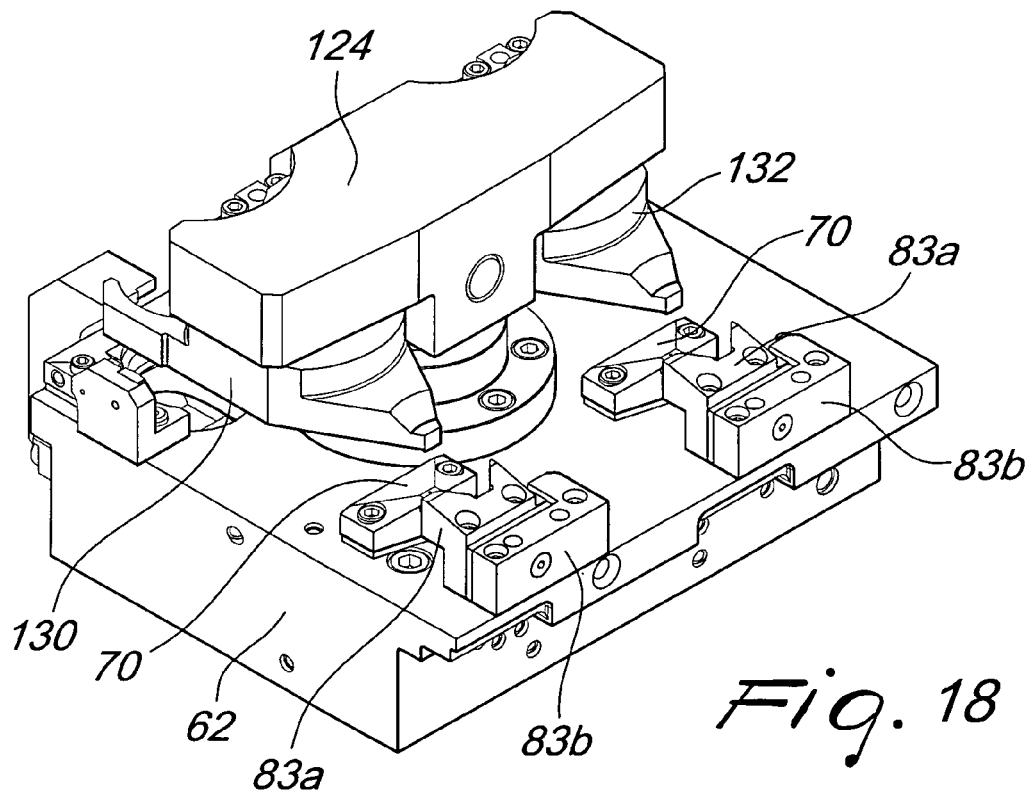
Figure 19:
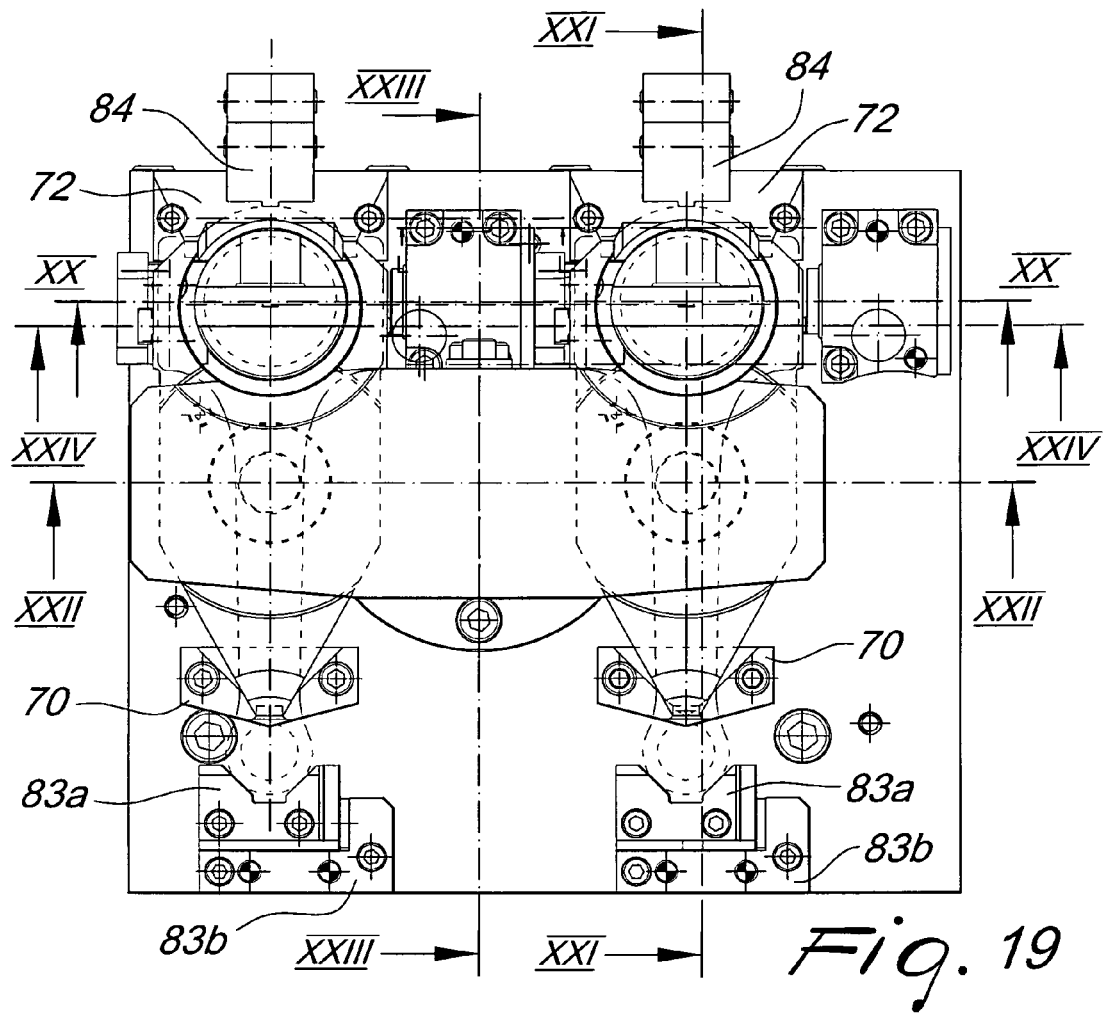
FIG. 19 is a plan view of the fourth component of FIGS. 16 to 18.

Pin 152 is axially anchored to bar-shaped support 124 by a washer 156, which is fixed to bar-shaped support 124 by a screw 157 and engages a transverse notch 158 formed on pin 152 (FIGS. 17, 23).

The vertical hydraulic cylinder (FIGS. 22, 23) comprises a vertical bore 160 formed in basement 62 and leading to the upper surface thereof. Operative rod 126 is coaxially connected to a piston 162 which is sealingly slidable within vertical bore 160 and divides the latter into two chambers.

The upper end of vertical bore 160 is sealingly closed by a cover 164 which is sealingly traversed by operative rod 126. The chamber on the side of the operative rod communicates with a fifth hydraulic line 168 (FIG. 22), which extends in basement 62 and leads to the lower surface of the latter at a position aligned to outlet M6' or M8', depending on the face of the crosspiece in question, via an opening which, in FIG. 16, is referred to as M8'* (M6'*). The chamber on the side facing away from the operative rod communicates with a sixth hydraulic line 170 (FIG. 22), which is formed in basement 62 and leads to the lower surface of the latter at a position aligned to outlets M5' or M7', depending on the face of the crosspiece in question, via an opening which, in FIG. 16, is referred to as M7'* (M5'*).

FIGS. 26 to 40 show a second example of workpiece-holding tool 260 installable on crosspiece 24. Tool 260 comprises a basement 262 supporting:

two support/control assemblies arranged side-by-side, each of which is adapted to support a respective connecting rod B1', B2' (for better clarity, the connecting rods are only diagrammatically shown with dashed lines in the Figures), two positioning assemblies arranged side-by-side, each of which is adapted to properly position a respective connecting rod in both the axial and the lateral direction, and a locking mechanism adapted to clamp both the connecting rods in the vertical direction after positioning.

One of the two support/control assemblies will be now described. The other assembly is substantially identical, except for minor parts which, if required, will be identified.

The support/control assemblies each comprise a first base 270, which supports the connecting rod near its small end, and a second base 272, which supports the connecting rod at its big end.

Figure 29:
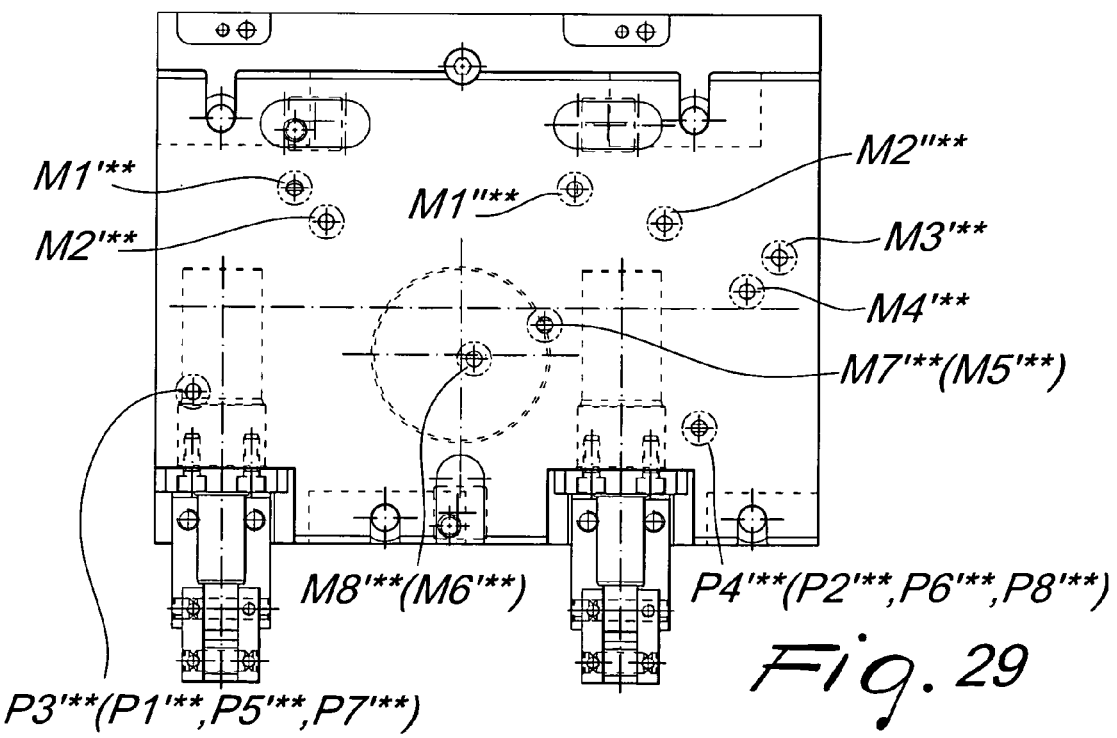
FIG. 29 is a plan view from below of the fifth component of FIGS. 26 and 27.
Figure 32:
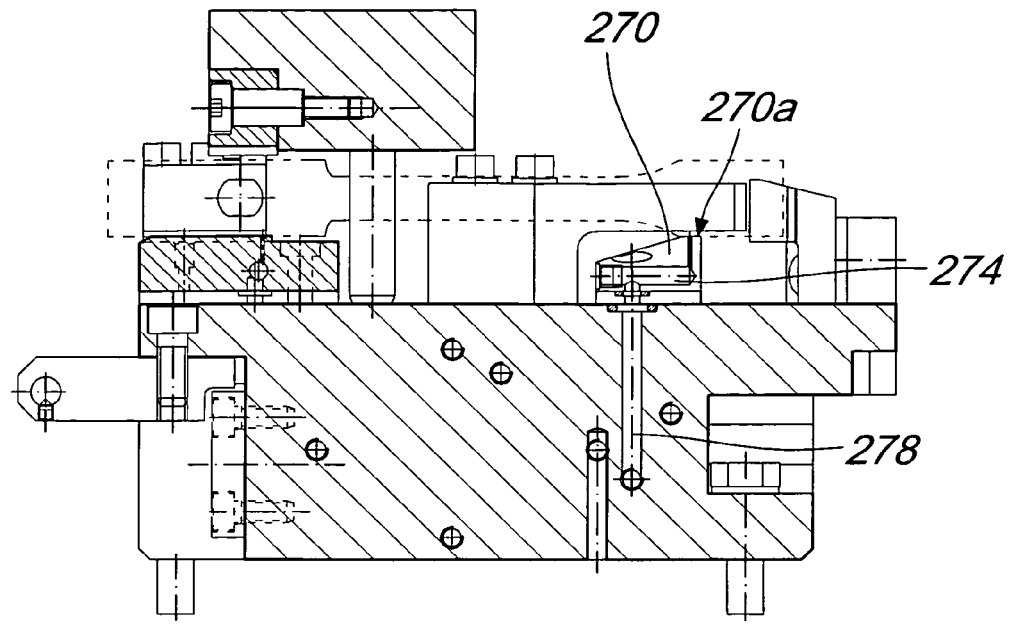
FIG. 32 is a view in cross-section of FIG. 28 along axis XXXII-XXXII.

Having now particular reference to FIG. 32, first base 270 has a frusto-pyramidal profile terminating with a first support surface 270a, which supports the connecting rod near its small end. A first pneumatic channel 274 leading to first support surface 270a is formed in the first base and communicates with a first pneumatic line, 276 or 278 depending on the support/control assembly face of the crosspiece in question, which is formed in basement 262 and leads to the lower surface of the latter at a position aligned to outlets P1', P3', P5', P7' or P2', P4', P6', P8' respectively, via openings which, in FIG. 29, are referred to as P3' (P1', P5'**, P7'*) and P4' (P6', P8', P2').

Figure 38:
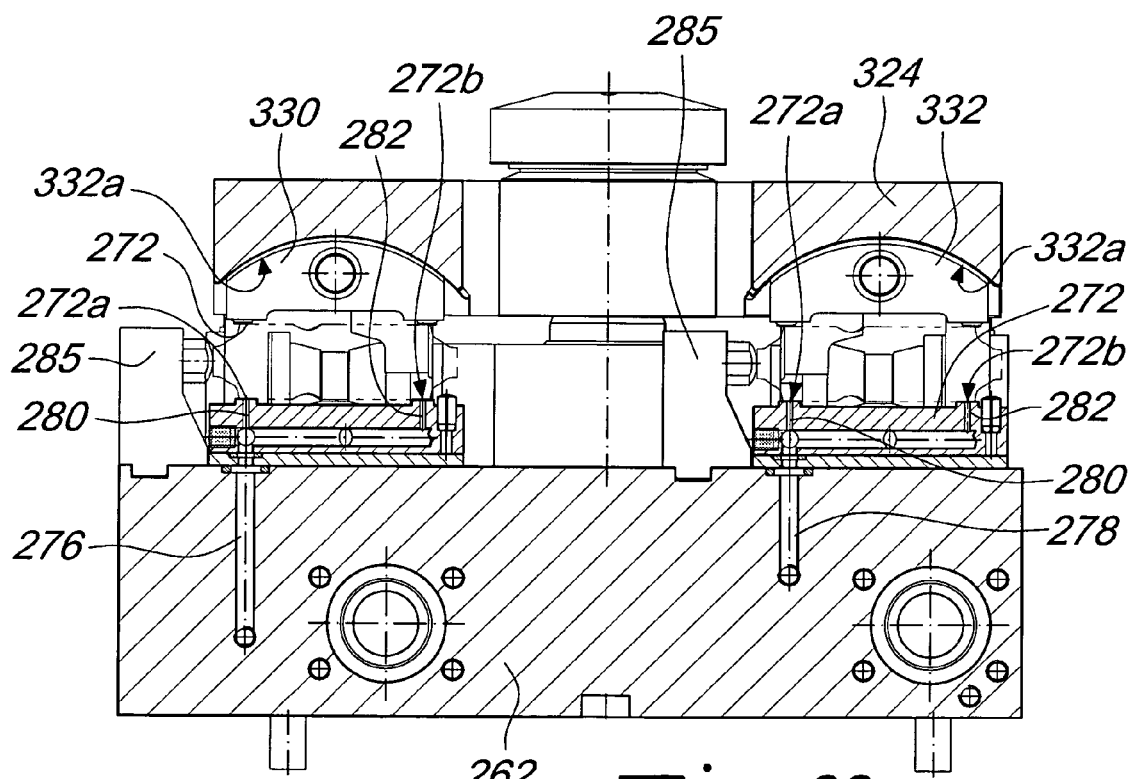
FIG. 38 is a view in cross-section of FIG. 28 along axis XXXVIII-XXXVIII.
Figure 40:
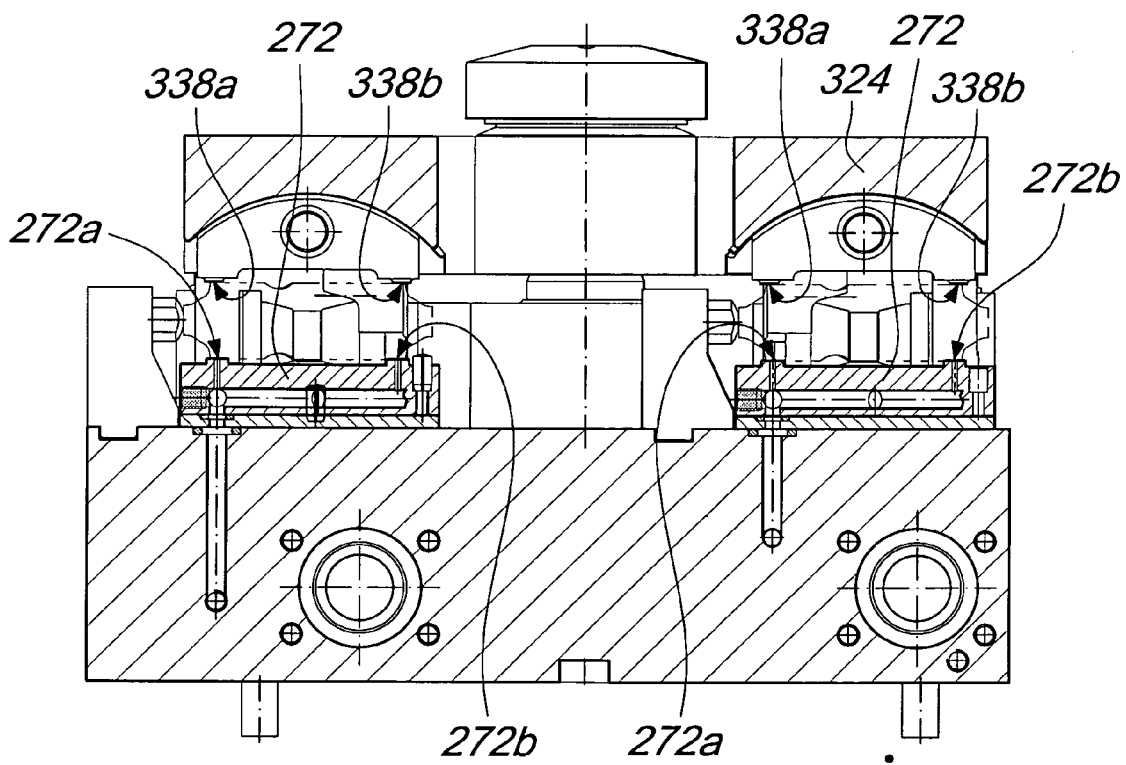
FIG. 40 is a view in cross-section of FIG. 28 along axis XL-XL.

Having now particular reference to FIGS. 38 and 40, second base 272 has two support surfaces 272a, 272b for supporting the big end of the connecting rod at two mirror-like areas with respect to the axis of the connecting rod. Two pneumatic channels 280, 282 leading to support surfaces 272a, 272b respectively, are formed in the base and also communicate with first pneumatic line 276 or 278.

Only one of the positioning assemblies will be described, the other assembly being substantially identical except for minor parts which, if necessary, will be identified.

For the axial positioning of the connecting rod, each positioning assembly comprises a V-shaped abutment 283a, which is fixed to basement 262 near first base 270 by a support 283b, and a first lateral abutment 285 (FIGS. 26, 27, 34) which is arranged by side of second base 272. A hydraulically operated pushing device engaging the big end in a direction parallel, though misaligned, to the axis of the connecting rod, biases both the small end against V-shaped abutment 283a and the big end against first lateral abutment 285.

Figure 30:
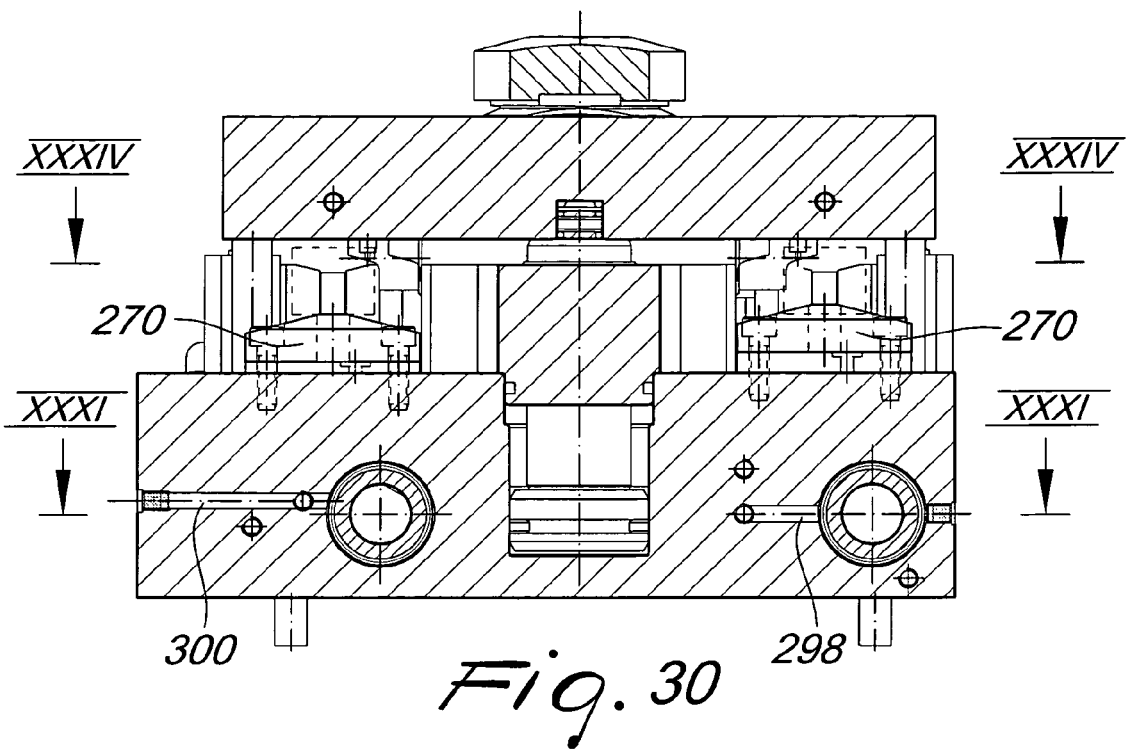
FIG. 30 is a view in cross-section of FIG. 28 along axis XXX-XXX.
Figure 31:
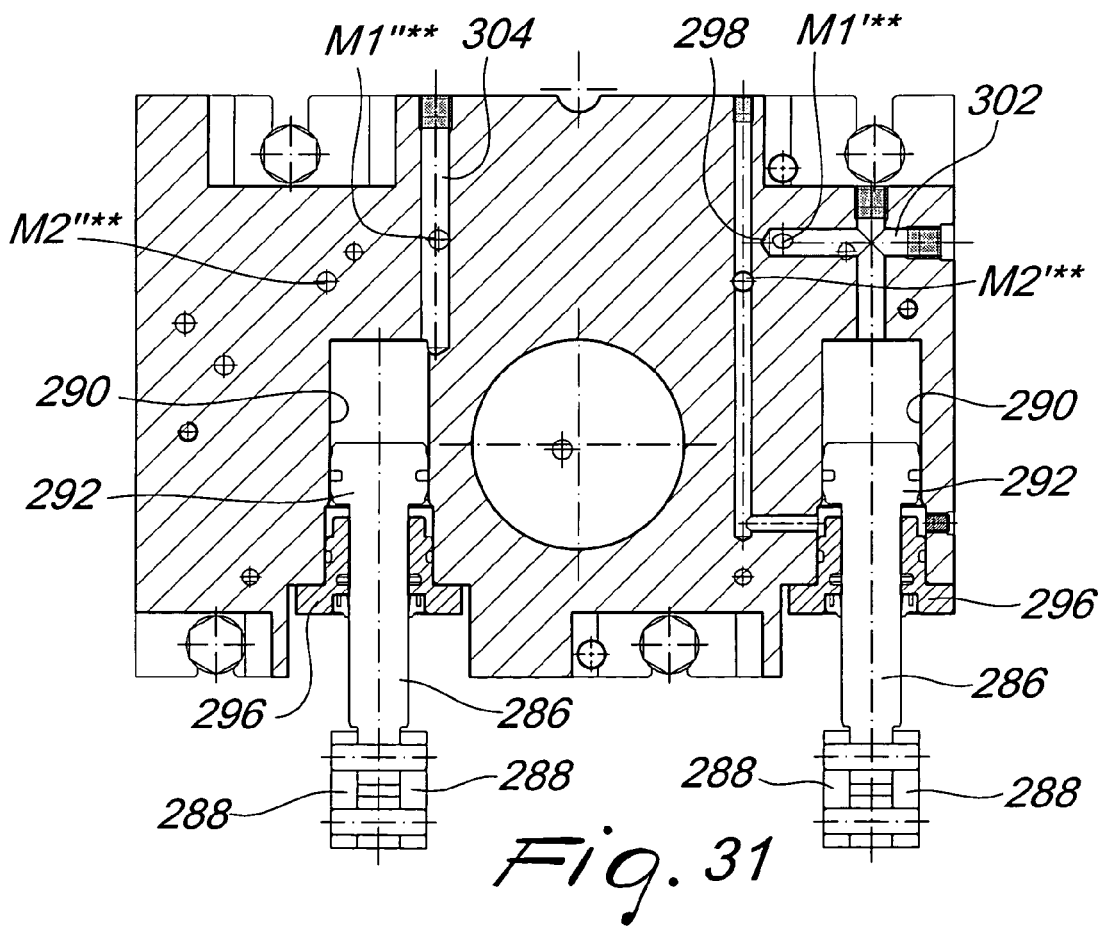
FIG. 31 is a view in cross-section of FIG. 30 along axis XXXI-XXXI.
Figure 37:
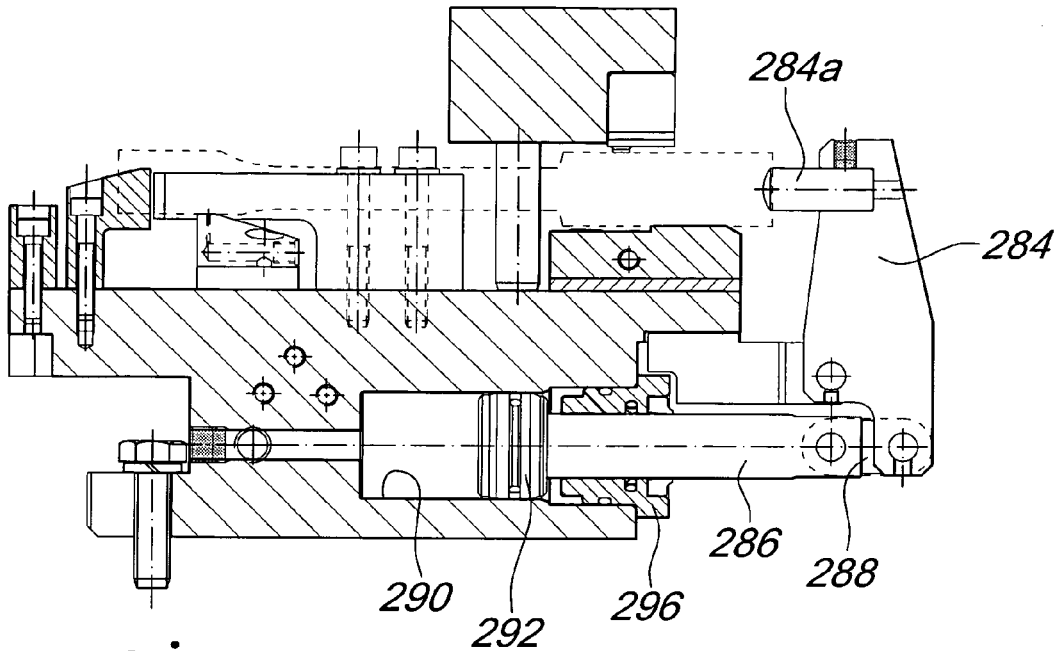
FIG. 37 is a view in cross-section of FIG. 28 along axis XXXVII-XXXVII.

With particular reference to FIGS. 30 to 31 and 37, the pushing device comprises a rocker arm 284, which is hinged at an intermediate point to basement 262. One end of rocker arm 284 bears a pin 284a provided with a beveled tip which is adapted to abut against the exterior of the big end. The opposite end 284b is operatively connected, via link rods 288, to an operative rod 286 of a horizontal, double-acting hydraulic cylinder embedded in basement 262.

The hydraulic cylinder comprises a cylindrical chamber 290 formed in the basement. A piston 292, to which operative rod 286 is coaxially connected, is sealingly slidable within cylindrical chamber. The cylindrical chamber leads to the outer surface of the basement, where it is sealingly closed by a cover 296 which is sealingly and slidably traversed by operative rod 286. The portion of the chamber on the side of the operative rod communicates with a first hydraulic line 298 or 300 (FIGS. 30, 31), depending on the positioning assembly in question, which is formed in basement 262 and leads to the lower surface of the latter at a position aligned to outlets M2' or M2", via openings which, in FIG. 29, are referred to as M2' and M2" respectively. The portion of the chamber on the side facing away from the operative rod communicates with a second hydraulic line 302 or 304, depending on the positioning assembly in question, which is formed in basement 262 and leads to the lower surface of the latter at a position aligned to outlets M1' or M1", via openings which, in FIG. 29, are referred to as M1' and M1".

Figure 26:
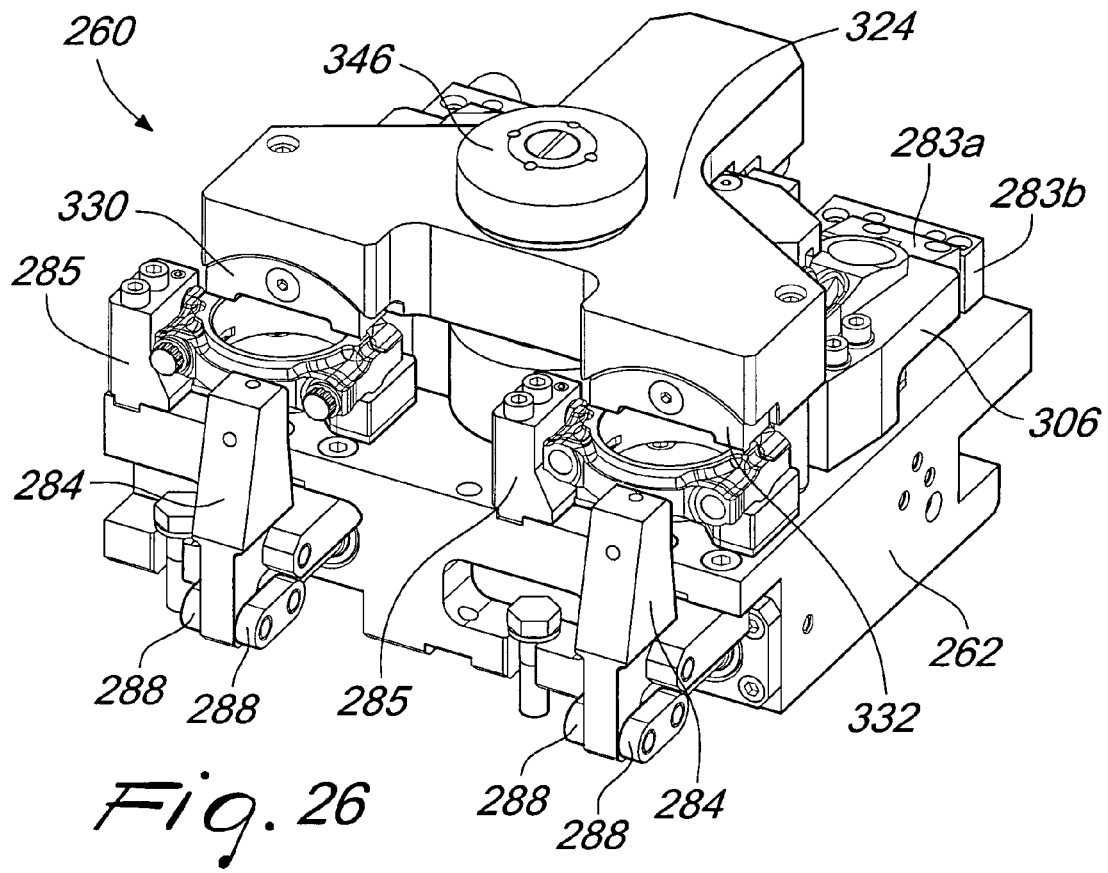
FIGS. 26 and 27 are two perspective views from different viewpoints of a fifth component of the workpiece-holding unit according to the invention.
Figure 27:
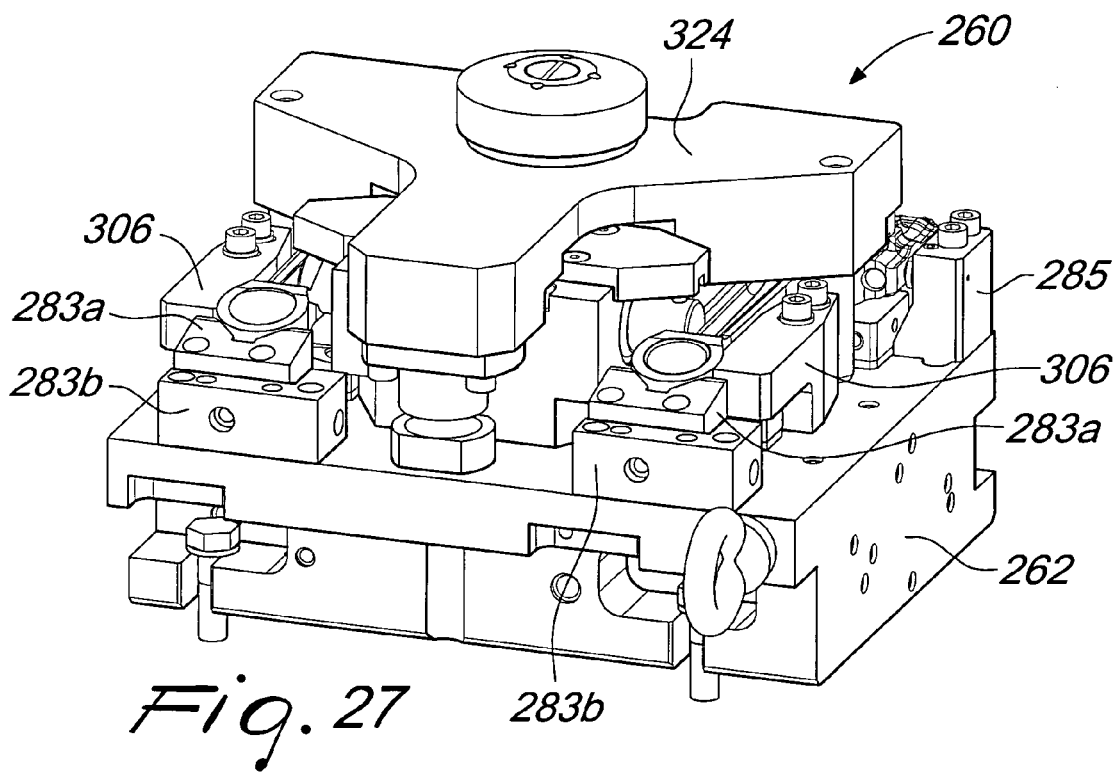
Figure 28:
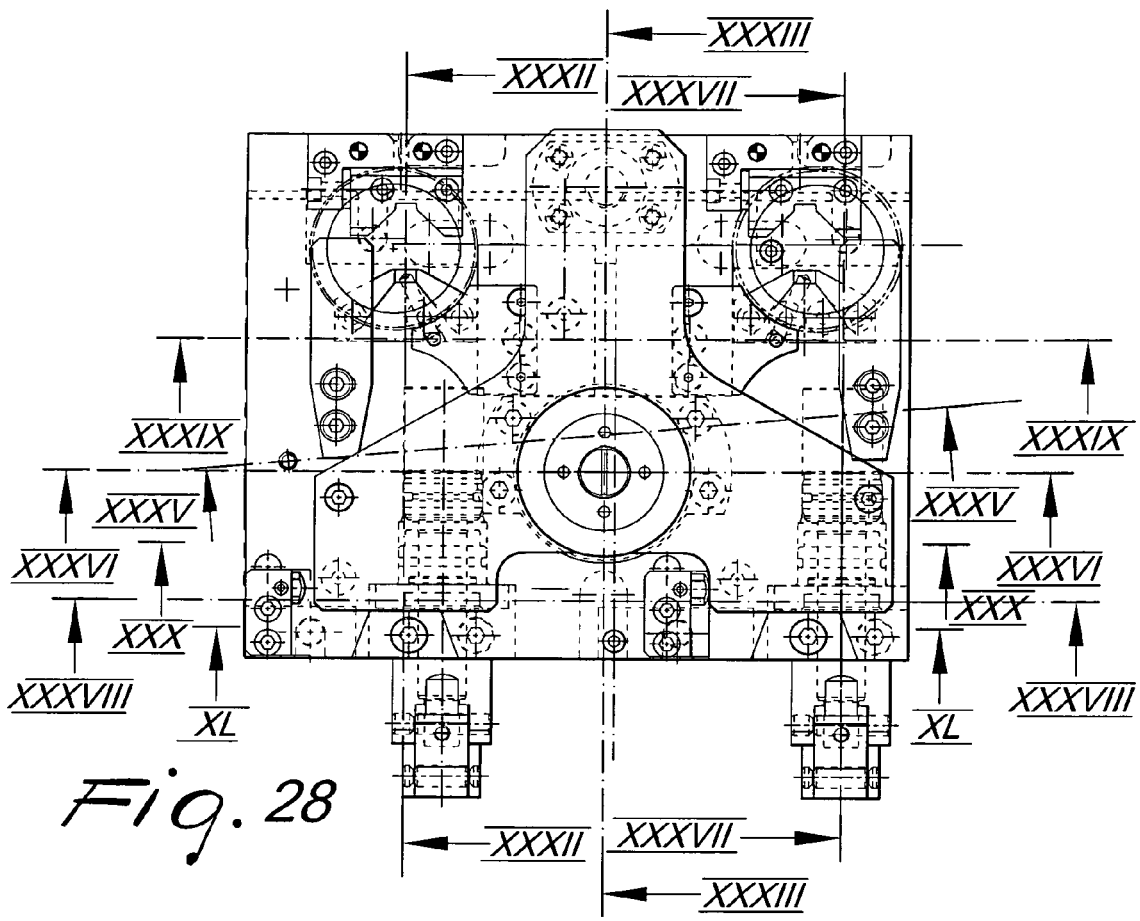
FIG. 28 is a plan view from above of the fifth component of FIGS. 26 and 27.
Figure 39:
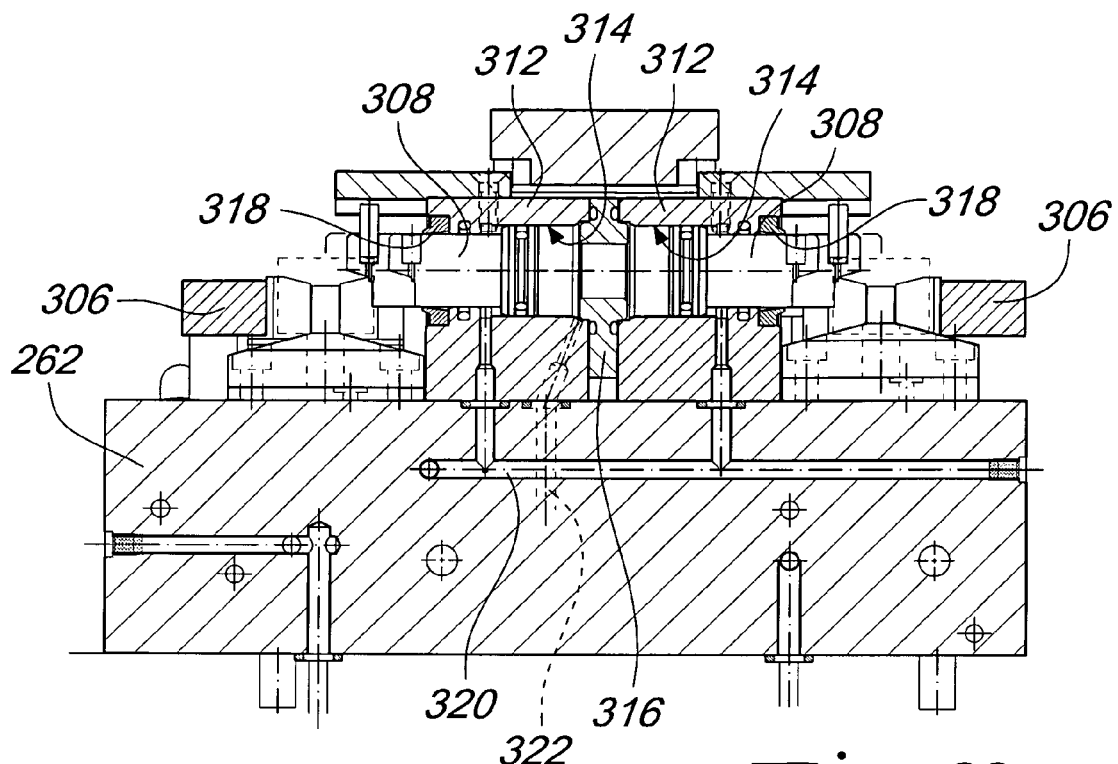
FIG. 39 is a view in cross-section of FIG. 28 along axis XXXIX-XXXIX.

Having now particular reference to FIGS. 26, 27 and 39, for the lateral positioning of the connecting rods, each positioning assembly comprises, for each connecting rod, a second lateral abutment 306 fixed to basement 262, against which the small end of the connecting rod is biased by the piston 308 of a respective double-acting hydraulic actuator 310, which radially operates in contrast to lateral abutment 306. The hydraulic actuators of the two positioning assemblies are fixed to the basement in such a way as to operate in opposite directions between the two connecting rods. Each hydraulic actuator comprises a prismatic housing 312 which is horizontally traversed by a hole 314 in which piston 308 is sealingly slidable. The holes of the two actuators, on the side facing away from the piston rod, communicate with each other via a spacing ring 316 which is sealingly interposed between the two housings. The opposite end of hole 314 is sealingly traversed by piston 308 and, to this purpose, is provided with seals such as 318 engaging the outer surface of the piston. Hole 314, on the side of the piston rod, communicates with a third hydraulic line 320 which feeds the hydraulic actuators of both the positioning assemblies. The third hydraulic line traverses basement 262 and leads to the lower surface of the latter at a position aligned to outlet M4', via an opening which, in FIG. 29, is referred to as M4'. Hole 314, on the side facing away from the piston rod, communicates with a fourth hydraulic line 322 which traverses basement 262 and leads to the lower surface of the latter at a position aligned to outlet M3', via an opening which, in FIG. 29, is referred to as M3'.

Having now particular reference to FIGS. 35, 36, 38, and 40, locking mechanism 268 comprises a horizontal, T-shaped support 324, which is supported at the intersection of the T-shape by the operative rod 326 of a double-acting, vertical hydraulic cylinder, which is embedded within basement 362 with its operative rod directed upwards. The opposite ends of the lateral arms of T-shaped support 324 support respective, swinging pushers 330, 332, which are received in respective seats 330a, 330b formed in the support and are adapted to portion of the push the big end of a respective connecting rod against second base 272. In particular, each of the pushing members 330, 332 is hinged at its middle point to the T-shape support, and is provided at its opposite ends with respective lower projections 338a, 338b (FIG. 40) counteposed to support surfaces 272a, 272b of second base 722, in order to clamp the connecting rod against the support surfaces while compensating for any positioning or manufacturing tolerances.

Figure 33:
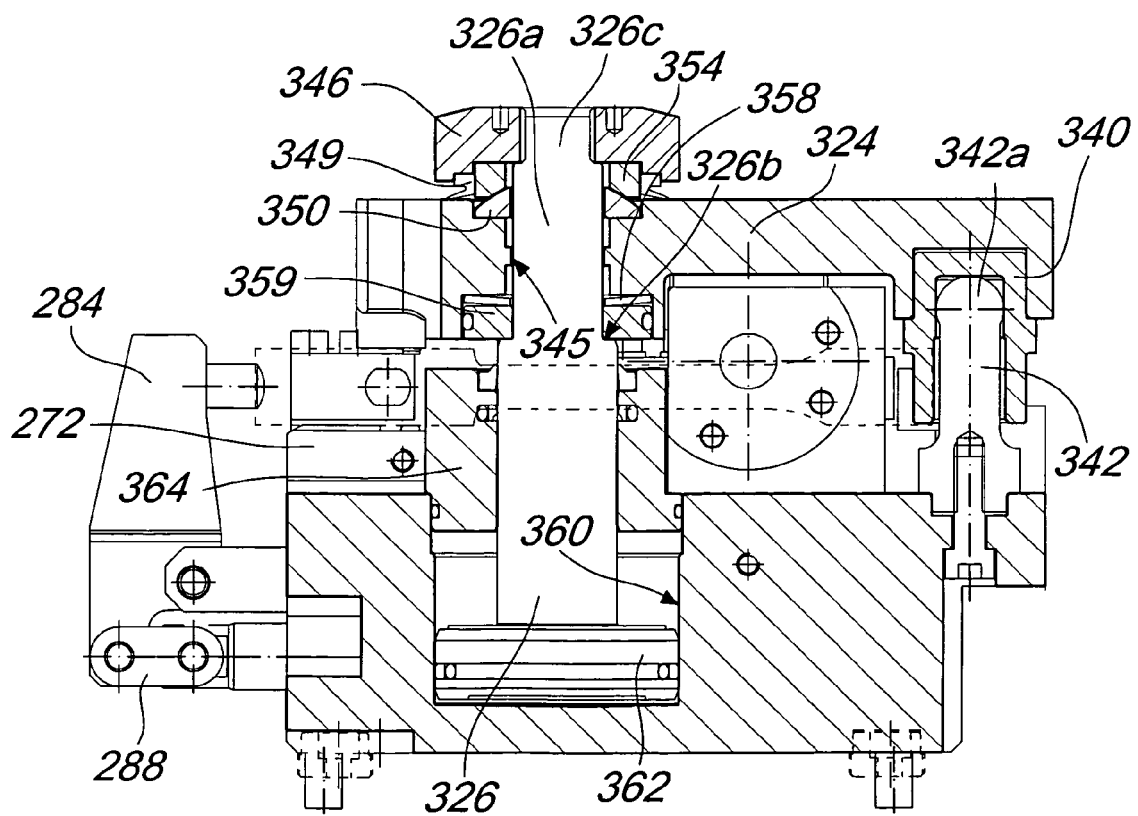
FIG. 33 is a view in cross-section of FIG. 28 along axis XXXIII-XXXIII.
Figure 34:
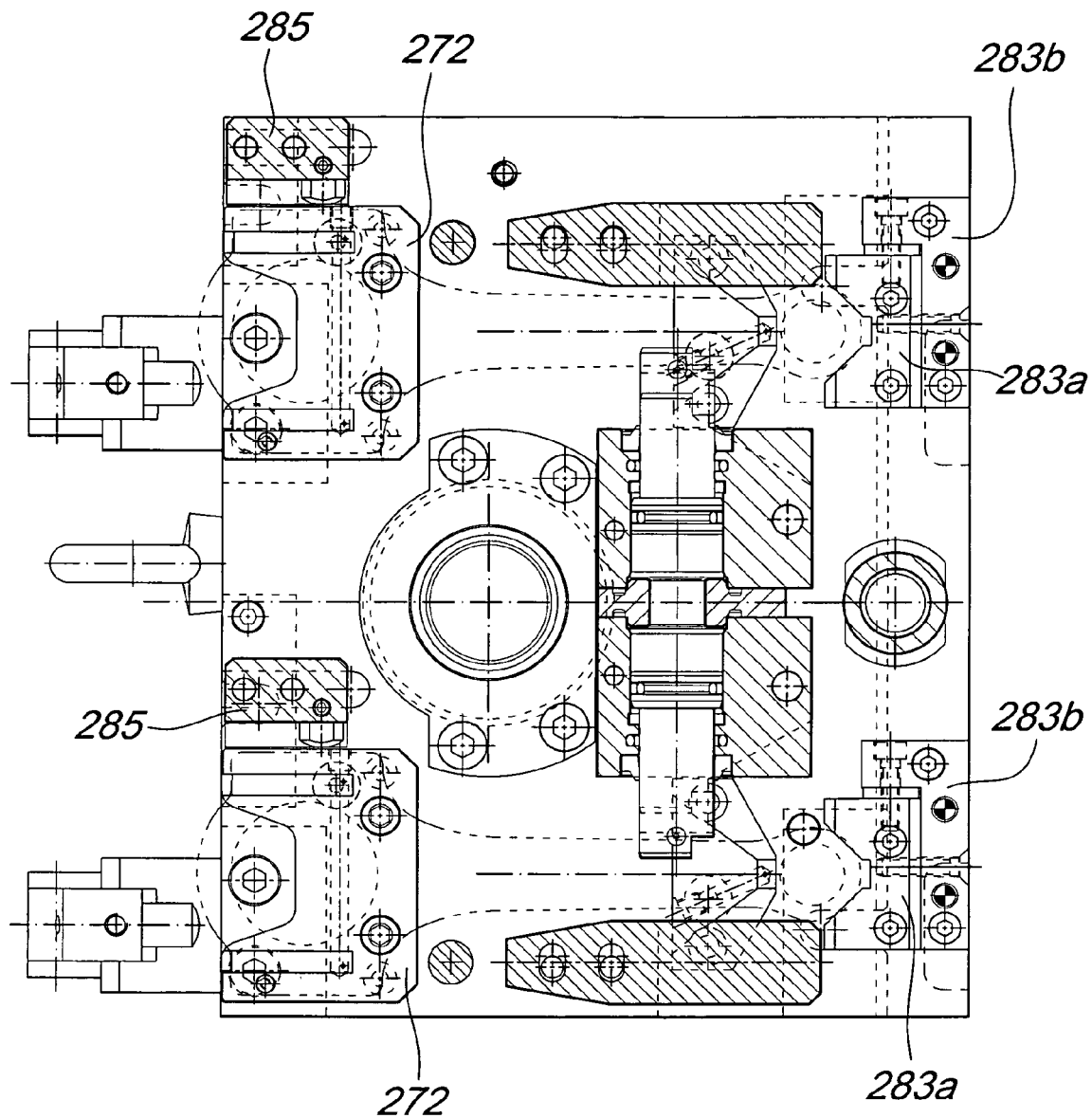
FIG. 34 is a view in cross-section of FIG. 30 along axis XXXIV-XXXIV.

Having now particular reference to FIG. 33, the free end of the middle arm of T-shaped support 324 lies, via an over-turned socket 340, on a spheric head 342a of a pole 342 which is vertically screwed to basement 262.

T-shaped support 324 is connected to operative rod 326 of vertical hydraulic cylinder 328 in a swinging manner. In more detail, having now particular reference to FIGS. 33, 36, operative rod 326 has an end portion 326a which is smaller in diameter, thereby defining an annular abutment 326b (FIG. 33). End portion 326a of operative rod 326 is inserted in a hole 345 (FIG. 33) of T-shaped support 324 and terminates with a threaded portion 326c, on which a nut 346 is screwed.

Figure 36:
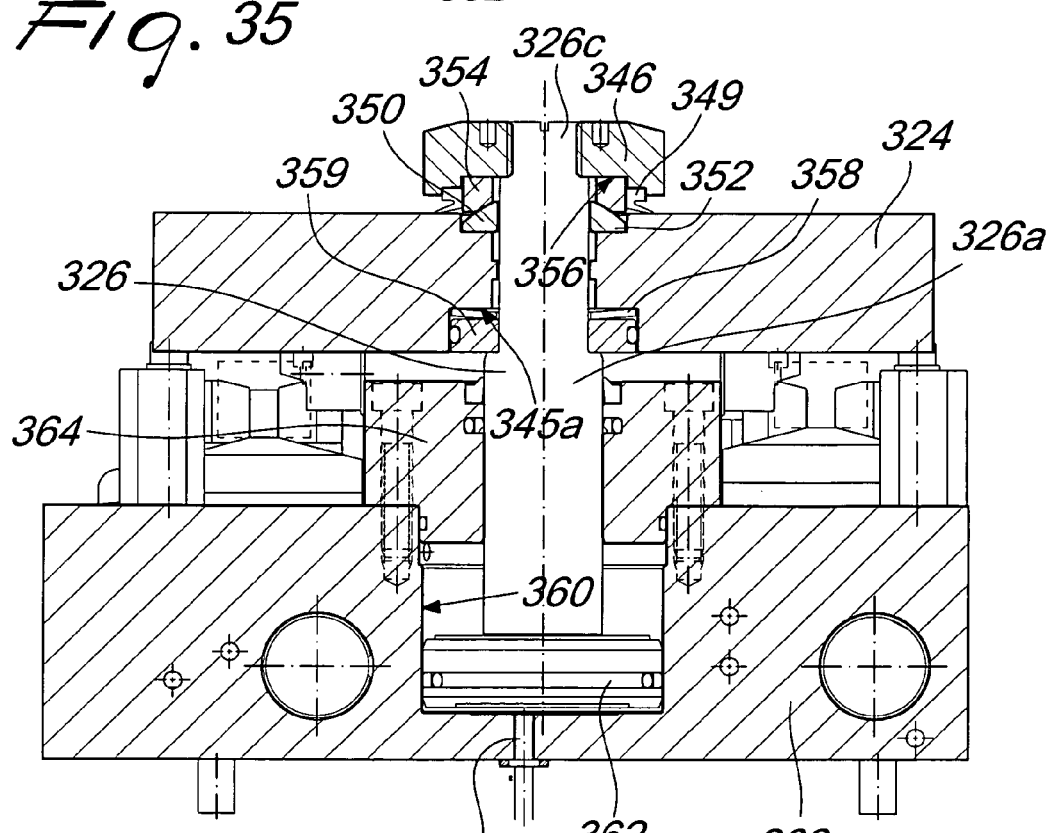
FIG. 36 is a view in cross-section of FIG. 28 along axis XXXVI-XXXVI.

A ball joint surrounded by a seal 349 is interposed between nut 346 and T-shaped support 324. Ball joint 348 consists of a male ring 350 having a spheric outer profile, which surrounds end portion 326a of operative rod 326, is housed in a seat 352 (FIG. 36) of T-shaped support, and is coupled to a female ring 354 having a frusto-conical inner profile, which is housed in a seat 356 of nut 346 (FIG. 36). Male ring 350 is elastically biased against female ring 354 by a Belleville washer 358 which is housed in a seat 345a (FIG. 36) formed at the opposite end of hole 345. Belleville washer 358 is pushed between the bottom of seat 345a and a ring 359, which is fitted to end portion 326a of operative rod 326 and engages annular abutment 326b.

Figure 35:
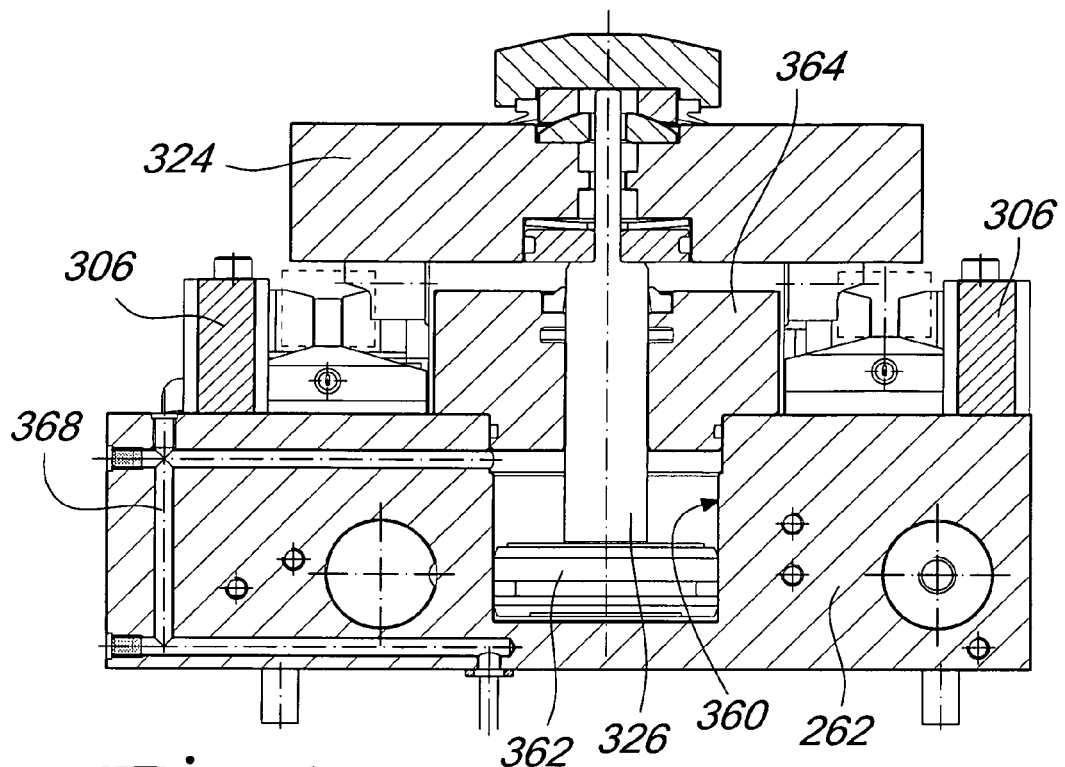
FIG. 35 is a view in cross-section of FIG. 28 along axis XXXV-XXXV.

Having now reference to FIGS. 33, 35, 36, the vertical hydraulic cylinder comprises a vertical bore 360 formed in basement 262 and leading to the upper surface thereof. Operative rod 326 is coaxially connected to a piston 362 which is sealingly slidable within vertical bore 360 and divides the latter into two chambers. The upper end of vertical bore 360 is sealingly closed by a cover 364 which is sealingly traversed by operative rod 326. The chamber on the side of the operative rod communicates with a fifth hydraulic line 368 (FIG. 35), which extends in basement 362 and leads to the lower surface of the latter at a position aligned to outlet M6' or M8', depending on the face of the crosspiece in question, via an opening which, in FIG. 29, is referred to as M8' (M6'). The chamber on the side facing away from the operative rod communicates with a passage 370 (FIG. 36) which leads to outlets M5' or M7', depending on the face of the crosspiece in question, via an opening which, in FIG. 29, is referred to as M7' (M5').

In operation, the workpiece-holding assembly according to the invention can be assembled by installing either sixteen tools of a same type on the crosspiece, e.g., sixteen tools of the second type as shown in FIG. 2, or four tools of the first type on one/two faces of the crosspiece, and tools of the second type on the remaining faces. As the person skilled in the art will easily appreciate, the hydraulic inlets and the pneumatic inlets are arranged at the same positions in both types of tools and perform compatible functions, as will be clarified below, so that any tool can be freely installed on any of the four faces of the crosspiece. This circumstance provides the workpiece-holding unit according to the invention with high versatility, according to the declared objects.

Once the operator has loaded the first eight connecting rods on the workpiece-holding tools installed on a first face of the crosspiece, the connecting rods are axially biased by the rocker arms against the respective V-shaped abutments by feeding oil at different pressures into lines M1, M2, with a force which can be adjusted to be relatively low, e.g., a few tenths of Kg, by (positive) difference between the pressure in the chamber facing away from the operative rod of the cylinders connected to the rocker arms, and the pressure in the chamber on the side of the operative rod. This prevents the connecting rods from being deformed due to excessive stress, which circumstance could affect the machining accuracy. By feeding pressurized oil at different pressures into lines M3, M4, the big ends of the connecting rods are laterally biased against the respective, lateral abutments. Even in this case, by adjusting the difference of pressure between the two chambers of the actuator, the force can be accurately adjusted to be relatively low. Finally, by feeding oil at different pressures to lines M5, M7 or M6, M8, depending on the face of the crosspiece in question, the connecting rods are clamped against the respective bases. Thereafter, the unit is rotated of a quarter turn and the positioning mechanisms are released, so that the operator can load further eight connecting rods on the workpiece-holding tools installed on a second face adjacent to the first one. Now, the connecting rods are first positioned and then locked by carrying out the same steps described above with reference to the first eight connecting rods. It should be noted that, when the locking mechanisms of the tools mounted on the second face are opened, as required for loading the further eight connecting rods, the first eight connecting rods will remain firmly locked because the hydraulic lines (M5, M7 or M6, M8) used for locking connecting rods on adjacent faces are independent from each other.

The pneumatic lines leading to the supporting surfaces of the bases act as pneumatic sensors. In fact, by feeding pressurized air in the pneumatic lines and controlling the pressure (by conventional equipment which is not described herein) it is possible to verify if the connecting rods are oriented and positioned correctly. The system of the invention also allows the four connecting rods on the left-side of the tools to be checked independently form the four connecting rods on the right side, on each face of the crosspiece. The holes in the bases are located in such a manner that they are hidden when a connecting rod is positioned and oriented correctly; in this case, a pressure increase is to be expected. Moreover, by locating the holes properly and, in case, by forming notches on the connecting rods at propers positions, as will be obvious to the person skilled in the art, it will also be possible to use the pneumatic lines for discriminating the type of connecting rod.

A few preferred embodiment of the invention have been described herein, but of course many changes may be made by a person skilled in the art within the scope of the claims. In particular, the shape and the positions of the outlets in the crosspiece and of the inlets in the workpiece-holding tools, as well as the positions of the hydraulic/pneumatic lines in the crosspiece, may be varied with respect to the examples described herein, though maintaining the same functions. Moreover, many other workpiece-holding tools based on the same principles of those described herein, but specifically designed for different types of connecting rods and/or of different machinings, may be devised by the skilled person by using the teachings given herein, and therefore should be regarded as falling within the same inventive concept. For example, in certain cases the locking mechanisms and the positioning mechanisms could be integrated in a single mechanism suitably designed to both position and lock the connecting rod. In addition, each workpiece-holding tool could be designed to support a different number of connecting rods.

The disclosures in Italian Utility Model Application No. TO2011U000082 from which this application claims priority are incorporated herein by reference.

What is claimed is:

1. A workpiece-holding unit for installation on machining centers for connecting rods, comprising:
   a crosspiece, which is adapted to be rotatably supported about an axis thereof in front of a machining head of a machining center and has internal, hydraulic longitudinal ducts, which communicate with respective hydraulic outlets on main faces of the crosspiece and are connected to hydraulic feed means, and
   at least two workpiece-holding tools, which are installable on one of said main faces of the crosspiece and are provided with respective positioning mechanisms and locking mechanisms for at least one connecting rod, which are hydraulically operated via respective hydraulic lines leading at positions aligned to said hydraulic outlets,
   the two workpiece-holding tools comprising a first workpiece-holding tool and a second workpiece-holding tool which are mutually different such that the locking mechanisms of said first and second workpiece-holding tools are adapted to engage said connecting rod at different positions on said connecting rod, and
   said hydraulic lines of said first and second workpiece-holding tools being arranged at said positions aligned with said hydraulic outlets of said crosspiece.

2. The workpiece-holding unit of claim 1, wherein said crosspiece has a substantially square section with four main faces, and the hydraulic lines operating the locking mechanisms of the workpiece-holding tools mounted on one face are connected to the hydraulic lines operating the locking mechanisms of the workpiece-holding tools mounted on the opposite face and are independent from the hydraulic lines operating the locking mechanisms of the workpiece-holding tools mounted on the adjacent faces.

3. The workpiece-holding unit of claim 1, wherein the hydraulic lines operating the positioning mechanisms of the workpiece-holding tools mounted on all the main faces are connected to each other.

4. The workpiece-holding unit of claim 1, wherein said crosspiece also has internal, pneumatic longitudinal ducts which communicate with respective pneumatic outlets on the main faces of the crosspiece and are connected to pneumatic feed means, and said at least one workpiece-holding tool is provided with pneumatic sensors, which are pneumatically operated via respective pneumatic lines leading at positions aligned to said pneumatic outlets.

5. The workpiece-holding unit of claim 4, wherein said pneumatic longitudinal ducts are all independent from one another.

6. The workpiece-holding unit of claim 1, wherein each of said workpiece-holding tool is adapted to support two connecting rods arranged side-by-side on respective bases, and said locking mechanisms comprise a support provided with two locking members counterposed to said bases and operatively connected to a hydraulic cylinder for clamping said connecting rods between said locking members and said bases.

7. The workpiece-holding unit of claim 6, wherein a first one of said bases has a first support surface arranged to support a respective connecting rod near a small end thereof, and a second one of said bases has two support surfaces arranged to support the connecting rod at a big end thereof at diametral opposite sides, and each of said locking members has a contact end counterposed to said first support surface, as well as two contact arms counterposed to said second support surfaces.

8. The workpiece-holding unit of claim 7, wherein each of said locking members is connected to the support via a ball joint.

9. The workpiece-holding unit of claim 6, wherein a first one of said bases has a first support surface arranged to support a respective connecting rod near a small end thereof, and a second one of said bases has two support surfaces arranged to support the connecting rod at a big end thereof at diametral opposite sides, and each of said locking members is hinged at a middle position to the support and is provided at opposite ends thereof with respective lower projections counterposed to support surfaces of said second one of said bases.

10. The workpiece-holding unit of claim 9, wherein said support has a middle arm projecting from the middle in a T-shaped configuration, a free end of which swingingly lies on a pole.

11. The workpiece-holding unit of claim. 9, wherein said support is connected to the operative rod of said hydraulic cylinder via a ball joint.

12. The workpiece-holding unit of claim 4, wherein said workpiece-holding support is provided with a first base having a first support surface arranged to support a respective connecting rod near a small end thereof, and a second base having two support surfaces arranged to support the connecting rod at a big end thereof at diametral opposite sides, and said pneumatic sensors comprise a first pneumatic channel leading to said first support surface and communicating with a first one of said pneumatic lines, and two pneumatic channels leading to support surfaces and also communicating with said first pneumatic line.

13. The workpiece-holding unit of claim 6, wherein said hydraulic cylinder is a double-acting hydraulic cylinder operated via two counter-acting ones of said hydraulic lines.

14. The workpiece-holding unit of claim 1, wherein, for each connecting rod supported on the workpiece-holding tool, said positioning mechanisms comprise a V-shaped abutment, against which the small end of the connecting rod is biased by a pushing device operated by a first hydraulic actuator, which engages the big end in the direction of the axis of the connecting rod, as well as a lateral abutment, against which the big end of the connecting rod is biased by a second hydraulic actuator which laterally engages the big end of the connecting rod.

15. The workpiece-holding unit of claim 1, wherein, for each connecting rod supported on the worlcpiece-holding tool, said positioning mechanisms comprise a V-shaped abutment and a first lateral abutment, against which the small end and the big end of the connecting rod are respectively biased by a pushing device operated by a first hydraulic actuator, which engages the big end in a direction parallel, though misaligned, to the axis of the connecting rod, as well as a second lateral abutment, against which the small end of the connecting rod is biased by a second hydraulic actuator, which laterally engages the connecting rod near a small end thereof.

16. The workpiece-holding unit of claim 14, wherein at least one of said first hydraulic actuator or second hydraulic actuator is a double-acting hydraulic actuator operated via two counter-acting ones of said hydraulic lines.

17. The workpiece-holding unit of claim 15, wherein at least one of said first hydraulic actuator or second hydraulic actuator is a double-acting hydraulic actuator operated via two counter-acting ones of said hydraulic lines.

18. The workpiece-holding unit of claim 14, wherein said pushing device comprises a rocker arm, which is hinged at an intermediate point to a basement of the workpiece-holding tool and has a contact end adapted to abut against the exterior of the big end and an opposite end operatively connected to said first hydraulic actuator.

19. The workpiece-holding unit of claim 15, wherein said pushing device comprises a rocker arm, which is hinged at an intermediate point to a basement of the workpiece-holding tool and has a contact end adapted to abut against the exterior of the big end and an opposite end operatively connected to said first hydraulic actuator.

20. The workpiece-holding unit of claim 1, wherein each of said at least one workpiece-holding tools is adapted to support two connecting rods, and said crosspiece has a row of four, outer ducts extending just below each of said main faces, as well as a row of four, inner ducts which are arranged alternately to the outer ducts at a slightly inner position, and each of said main faces has a series of consecutive areas, each of which is engageable by a respective workpiece-holding tool and has outlets in communication with respective ones of said ducts, said outlets having the same arrangement in each area.

* * * * *